United States Patent
Iwasaki et al.

(10) Patent No.: US 9,523,803 B2
(45) Date of Patent: Dec. 20, 2016

(54) IMAGE CAPTURING ELEMENT AND IMAGE CAPTURING APPARATUS FOR REMOVING INFRARED COMPONENTS FROM LIGHT

(71) Applicant: SONY CORPORATION, Tokyo (JP)

(72) Inventors: Masanori Iwasaki, Kanagawa (JP); Nozomi Kimura, Kanagawa (JP); Taichi Natori, Kanagawa (JP); Ken Ozawa, Kanagawa (JP); Nobuyuki Matsuzawa, Tokyo (JP); Daisuke Hobara, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/435,157

(22) PCT Filed: Sep. 2, 2013

(86) PCT No.: PCT/JP2013/005169
§ 371 (c)(1),
(2) Date: Apr. 10, 2015

(87) PCT Pub. No.: WO2014/061188
PCT Pub. Date: Apr. 24, 2014

(65) Prior Publication Data
US 2015/0331163 A1    Nov. 19, 2015

(30) Foreign Application Priority Data
Oct. 17, 2012    (JP) ................................ 2012-230325

(51) Int. Cl.
*H04N 5/225*      (2006.01)
*G02B 5/22*      (2006.01)
(Continued)

(52) U.S. Cl.
CPC ............... *G02B 5/208* (2013.01); *G02B 5/201* (2013.01); *G02B 5/22* (2013.01); *G02B 5/26* (2013.01);
(Continued)

(58) Field of Classification Search
CPC ........... G02B 5/208; G02B 5/201; G02B 5/22; G02B 5/26; H01L 27/1462; H01L 27/14621; H01L 27/14625; H01L 27/14627; H01L 27/14685; H04N 5/2254; H04N 5/33; H04N 5/3458; H04N 9/045
See application file for complete search history.

(56) References Cited

U.S. PATENT DOCUMENTS 6,586,811 B2 *  7/2003  Sekine .............. H01L 27/14621
                                                                        257/432
7,084,472 B2 *  8/2006  Fukuyoshi ........... G02B 3/0012
                                                                        257/432
(Continued)

FOREIGN PATENT DOCUMENTS

JP      HEI 08-211336 A      8/1996
JP      2002-200360 A      7/2002
(Continued)

*Primary Examiner* — Nicholas Giles
(74) *Attorney, Agent, or Firm* — Chip Law Group

(57) ABSTRACT

To provide an image capturing element and an image capturing apparatus in which an image capturing optical system can be thinned without degrading image capturing properties.

An image capturing element according to an embodiment of the present technology includes an on-chip lens, a low refractive index layer and an infrared absorption layer. The on-chip lens is composed of a high refractive index material. The low refractive index layer is formed flatly on the on-chip lens and is composed of a low refractive index material. The infrared absorption layer is laminated above the low refractive index layer and is composed of an infrared absorption material.

17 Claims, 13 Drawing Sheets

(51) Int. Cl.
*G02B 5/26* (2006.01)
*G02B 5/20* (2006.01)
*H04N 5/345* (2011.01)
*H04N 5/33* (2006.01)
*H01L 27/146* (2006.01)
*H04N 9/04* (2006.01)
*H04N 5/44* (2011.01)

(52) U.S. Cl.
CPC ..... *H01L 27/1462* (2013.01); *H01L 27/14621* (2013.01); *H01L 27/14625* (2013.01); *H01L 27/14627* (2013.01); *H01L 27/14685* (2013.01); *H04N 5/2254* (2013.01); *H04N 5/33* (2013.01); *H04N 5/3458* (2013.01); *H04N 9/045* (2013.01); *H04N 2005/4426* (2013.01)

(56) References Cited

U.S. PATENT DOCUMENTS

| | | | | |
|---|---|---|---|---|
| 7,087,945 | B2* | 8/2006 | Nakai | H01L 27/14625 257/288 |
| 7,453,130 | B2* | 11/2008 | Nakai | H01L 27/14625 257/432 |
| 2001/0051405 | A1* | 12/2001 | Sekine | H01L 27/14621 438/208 |
| 2004/0183086 | A1* | 9/2004 | Nakai | H01L 27/14625 257/98 |
| 2004/0185588 | A1* | 9/2004 | Fukuyoshi | G02B 3/0012 438/22 |
| 2008/0174689 | A1* | 7/2008 | Furukawa | H01L 27/14627 348/340 |
| 2012/0126355 | A1* | 5/2012 | Mizuno | C23C 16/40 257/432 |
| 2014/0091419 | A1* | 4/2014 | Hasegawa | G02B 13/004 257/432 |
| 2014/0339509 | A1* | 11/2014 | Choi | H01L 51/5275 257/40 |

FOREIGN PATENT DOCUMENTS

| | | |
|---|---|---|
| JP | 2004-200360 A | 7/2004 |
| JP | 2005-019573 A | 1/2005 |
| JP | 2005-345680 A | 12/2005 |
| JP | 2006-024832 A | 1/2006 |
| JP | 2006-313974 A | 11/2006 |
| JP | 2007-019435 A | 1/2007 |
| JP | 2007-141876 A | 6/2007 |
| JP | 2007-242877 A | 9/2007 |
| JP | 2007-277502 A | 10/2007 |
| JP | 2008-091535 A | 4/2008 |
| JP | 2011-074270 A | 4/2011 |
| JP | 2011-199798 A | 10/2011 |
| JP | 2012-169489 A | 9/2012 |

* cited by examiner

IMAGE CAPTURING ELEMENT AND IMAGE CAPTURING APPARATUS FOR REMOVING INFRARED COMPONENTS FROM LIGHT

TECHNICAL FIELD

The present technology relates to an image capturing element and image capturing apparatus for removing infrared components from light incident to the image capturing element.

BACKGROUND ART

An image capturing apparatus such as a video camera and a digital still camera is used for capturing a color image. A solid state image capturing element (composed of plurality of photoelectric conversion elements) such as CCD (Charge Coupled Device) and CMOS (Complementary Metal Oxide Semiconductor) image sensors used in these cameras has sensitivity to from near-infrared wavelength bandwidth to near-ultraviolet wavelength bandwidth.

However, when the color image is captured, light signals in wavelength bandwidths that are invisible by a human eye (about 400 to 700 nm is visible) are noise components for a correct color image. Then, in order to provide the correct color image, by disposing infrared cut filters at photoelectric conversion elements of the solid state image capturing element, signals where light in the near-infrared wavelength bandwidth is removed should be detected.

In general, the infrared cut filters are disposed between an image capturing optical system and the solid state image element, an absorption type infrared cut filter composed of an infrared bandwidth absorption material and a reflective infrared cut filter utilizing a multilayer film interference.

In recent years, the image capturing apparatus is downsized. In general, the infrared cut filter has a thickness of about 1 to 3 mm. To thin the digital camera, the thickness of the infrared cut filter becomes a problem. In particular, in a camera module mounted to a mobile phone or a mobile terminal, it is essential to thin the image capturing optical system. In addition, the infrared cut filter should be mounted on the image capturing apparatus together with the solid state image capturing element. In terms of a production cost of the image capturing apparatus, an improvement is desirable.

Patent Document 1 discloses a solid state image capturing element where a flattened layer and on-chip lenses having an infrared absorption ability are laminated on photoelectric conversion elements. By providing the flattened layer and the on-chip lenses with the infrared absorption ability, the image capturing optical system can be thinned without disposing the infrared cut filters separately from the solid state image capturing element.

Patent Document 2 discloses a solid state image capturing element where an infrared absorption material is added to color filters disposed on photoelectric conversion elements, thereby removing infrared components by the color filters. Also, the image capturing optical system can be thinned without disposing the infrared cut filters separately from the solid state image capturing element.

Patent Document 1: Japanese Patent Application Laid-open No. 2004-200360

Patent Document 2: Japanese Patent Application Laid-open No. 2007-141876

SUMMARY OF INVENTION

Problem to be Solved by the Invention

However, the solid state image capturing elements described in Patent Documents 1 and 2 have the following problem. Specifically, when the on-chip lenses and the color filter are provided with the infrared absorption ability, these are thickened and light incident on the photoelectric conversion elements may be optically affected.

In order to provide a sufficient infrared absorption ability, a certain amount of the infrared absorption material should be added to the on-chip lenses and the color filters. However, if a concentration of the infrared absorption material is increased, a transmission amount of visible light is decreased. The concentration of the infrared absorption material is limited. Accordingly, the on-chip lenses and the color filters have to be thickened.

On the other hand, if the on-chip lenses and the color filters are thickened, a distance between each lens surface of the on-chip lenses and each photoelectric conversion element is increased. As a result, light incident on one on-chip lens disposed on one photoelectric conversion element is incident on adjacent photoelectric conversion element, which may degrade a pixel resolution and a color separation.

When the infrared absorption layer is disposed integrally with the solid state image capturing element, the infrared absorption layer should withstand the temperature over 180° C. in view of production and assemble steps into consideration as different from the related art.

In the solid state image capturing element described in Patent Document 1, it is difficult to provide the thicknesses of the on-chip lenses such that a sufficient infrared absorption property is provided, although the material having a heat resistance over 180° C. but the above-described infrared absorption intensity conditions cannot be satisfied at the same time. Also in the solid state image capturing element described in Patent Document 2, it is difficult to be implemented in view of the heat resistance of the material over 180° C.

In view of the above-described circumstances, an object of the present technology is to provide an image capturing element and an image capturing apparatus in which an image capturing optical system can be thinned without degrading image capturing properties.

Means for Solving the Problem

In order to achieve the above-described object, an image capturing element according to an embodiment of the present technology includes an on-chip lens, a low refractive index layer and an infrared absorption layer.

The on-chip lens is composed of a high refractive index material.

The low refractive index layer is formed flatly on the on-chip lens and is composed of a low refractive index material.

The infrared absorption layer is laminated above the low refractive index layer and is composed of an infrared absorption material.

According to the configuration, as the image capturing element includes the infrared absorption layer, the infrared cut filters does not need to be disposed separately from the solid state image capturing element and the image capturing optical system can be thinned. In addition, as the infrared absorption layer is laminated above the on-chip lenses, a distance between each of the on-chip lenses and each of the photoelectric conversion elements (laminated lower than the on-chip lenses) is similar to the case that no infrared absorption layer is disposed. If the distance between each of the on-chip lenses and each of the photoelectric conversion elements is increased, light incident on the on-chip lens is incident on adjacent photoelectric conversion element, which may degrade the image capturing properties. However, according to the above-described configuration, the distance between each of the on-chip lenses and each of the photoelectric conversion elements is not increased and it is possible to prevent the degradation of the image capturing properties.

The infrared absorption material may include an infrared absorption pigment.

According to the configuration, as the infrared absorption pigment absorbs infrared components included in the light incident on the image capturing element.

The infrared absorption material may include at least one of a binder resin and an additive.

According to the configuration, the material provided by mixing the infrared absorption pigment with the binder resin or the additive can be used as the infrared absorption material. The infrared absorption pigment is dispersed in the binder resin. The additive is a stabilizer, an antioxidant or the like.

The infrared absorption material may have a heating yellowing temperature of 180° C. or more.

Unlike in the case that the infrared cut filter including the infrared absorption pigment is disposed separately from the image capturing element, the image capturing element according to the present technology includes the infrared absorption layer. Here, the infrared absorption layer may be exposed to high temperature during a manufacturing process or operation of the image capturing element. By using the infrared absorption material having a heating yellowing temperature of 180° C. or more, it is possible to prevent visible light transmittance of the infrared absorption layer from lowering by heat.

The infrared absorption pigment may have a maximum absorption wavelength of 600 nm to 1200 nm and have a molar absorbance coefficient of 1000 L/mol·cm or more.

By this configuration, the infrared absorption material including infrared absorption pigment can effectively remove infrared components within an infrared wavelength bandwidth (600 nm to 1200 nm).

The infrared absorption layer may have a thickness of 1 μm to 200 μm.

By this configuration, the infrared components included in the light incident on the image capturing element can be removed by the infrared absorption layer. In the image capturing element according to the present technology, the thickness of the infrared absorption layer does not affect the distance between the on-chip lenses and the photoelectric conversion element. It is thus possible to have a sufficient thickness in the infrared absorption layer that is necessary to remove the infrared components.

The image capturing element may further includes a multilayer infrared reflection layer composed of a multilayer film of a high refractive index material and a low refractive index material and laminated above the low refractive index layer.

By this configuration, it is possible to remove the infrared components in the incident light not only in the infrared absorption layer but also in the multilayer infrared reflection layer. The multilayer infrared reflection layer utilizes light interference between multilayer films, whereby a transmission wavelength may be shifted depending on a light incident angle of the incident light. Even in such a case, it is possible to maintain a transmission wavelength bandwidth by the infrared absorption layer where the transmission wavelength is not shifted in principle.

The image capturing element may further includes a reflection prevention layer laminated as an uppermost layer for preventing reflection of light incident from an upper layer side or a lower layer side.

The light incident on the image capturing element may be slightly reflected at an interface between the respective layers. Once such reflected light reach the photoelectric conversion elements of the image capturing element, the light that is not a true image capturing light is incident on the photoelectric conversion elements, thereby decreasing the image capturing properties. Here, by preventing the reflected light from reflecting again by the reflection prevention layer, it is possible to prevent the image capturing properties from lowering.

The image capturing element may further includes a color filter layer laminated below the on-chip lens.

By this configuration, the incident light where the infrared components are removed by the infrared absorption layer is changed to a light having a predetermined wavelength bandwidth (for example, red, green or blue) by a color filter disposed corresponding to the photoelectric conversion elements and is incident on the photoelectric conversion elements. In other words, by disposing a color filter layer, it is possible to capture color images.

The color filter layer may have an infrared absorption ability.

By this configuration, it is possible to remove the infrared components of the incident light not only by the infrared absorption layer but also by the color filter layer. Absorption of the infrared components can be shared by the infrared absorption layer and the color filter layer. It is thus possible to sufficiently remove the infrared components without increasing the thickness of the color filer.

The image capturing element may further includes a support substrate for supporting the infrared absorption layer.

By this configuration, the infrared absorption layer laminated on the support substrate is produced separately from a lower layer structure (the photoelectric conversion layer, the on-chip lens, the low refractive index layer, etc.) and is laminated on the lower layer structure. In other words, as it is possible to produce the lower layer structure and the infrared absorption layer in a separate production process, the existing production apparatus can be advantageously used for the production.

The image capturing element may further includes a support substrate for supporting the multilayer infrared reflection layer.

By this configuration, the multilayer infrared absorption layer laminated on the support substrate is produced separately from a lower layer structure and is laminated on the lower layer structure. In other words, as it is possible to produce the lower layer structure and the infrared absorption layer in a separate production process.

The support substrate may further supports the infrared absorption layer.

By this configuration, the infrared absorption layer and the multilayer film infrared absorption layer laminated on the support substrate is produced separately from the lower layer structure and is laminated on the lower layer structure. In other words, it is possible to produce the lower layer structure, the infrared absorption layer and the multilayer film infrared absorption layer in a separate production process.

The image capturing element may further includes an adhesion layer composed of an adhesive material laminated on the low refractive index layer.

By this configuration, the support substrate on which the infrared absorption layer and the multilayer film infrared absorption layer are laminated as described above can be laminated on the low refractive index layer via the adhesion layer. Note that as the support substrate can be removed after adhesion, the image capturing element may not include the support substrate.

In order to achieve the above-described object, an image capturing apparatus according to an embodiment of the present technology includes an image capturing element and an image capturing optical system.

The image capturing element includes an on-chip lens composed of a high refractive index material; a low refractive index layer composed of a low refractive index material formed flatly on the on-chip lens; and an infrared absorption layer composed of an infrared absorption material laminated above the low refractive index layer.

The image capturing optical system captures an image of an object on the image capturing element.

By this configuration, as the infrared components are removed in the image capturing element, the infrared cut filters are no need to be disposed separately from the image capturing element and the image capturing optical system can be thinned.

The image capturing apparatus may further includes an infrared cut filter disposed within the image capturing optical system or between the image capturing element and the image capturing optical system for decreasing infrared components.

In a typical image capturing apparatus, the infrared cut filter for removing the infrared components is disposed separately from the image capturing element. However, by the above-described configurations, as the image capturing element can remove the infrared components, there is no need to remove all infrared components by the infrared cut filter and it is thus possible to thin the infrared cut filter. As the infrared cut filter, the infrared absorption filter composed of the above-described infrared absorption material, a multilayer film infrared reflection filter or the both may be used. A color separation filter may be used as the infrared cut filter.

Effect of the Invention

As described above, according to the present technology, there can be provided an image capturing element and an image capturing apparatus in which an image capturing optical system can be thinned without degrading image capturing properties.

MODES FOR CARRYING OUT THE INVENTION

First Embodiment

An image capturing element according to the embodiment of the present technology will be described. The image capturing element according to the embodiment can be mounted on an image capturing apparatus (such as a camera) together with an image capturing optical system for forming an image of an object on the image capturing element.

[Structure of Image Capturing Element]

Figure 1:
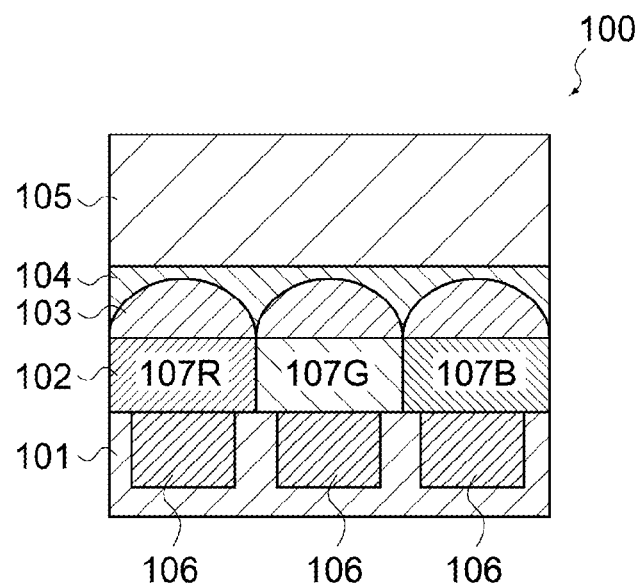
FIG. 1 A schematic diagram of an image capturing element according to a first embodiment of the present technology.

FIG. 1 is a schematic diagram of an image capturing element 100 according to the first embodiment of the present technology. As shown in the same figure, the image capturing element 100 is configured of a photoelectric conversion layer 101, a color filter layer 102, on-chip lenses 103, a low refractive index layer 104 and an infrared absorption layer 105 laminated.

The photoelectric conversion layer 101 includes a plurality of photoelectric conversion elements 106. Specifically, the photoelectric conversion layer 101 is provided by forming circuits of the photoelectric conversion elements 106 on a substrate, i.e., a silicon substrate. The photoelectric conversion layer 101 can have a CCD (Charge Coupled Device) structure and a CMOS (Complementary Metal Oxide Semiconductor).

The photoelectric conversion layer 101 may be an image sensor where the photoelectric conversion elements 106 are arrayed two dimensionally (matrix) or may be a line sensor where the photoelectric conversion elements 106 are arrayed in one dimensionally (linearly).

The color filter layer 102 is laminated on the photoelectric conversion layer 101 and has color filters corresponding to the photoelectric conversion elements 106. Specifically, the color filters may be three color filters, i.e., a red color filter 107R for transmitting a red color wavelength bandwidth, a green color filter 107G for transmitting a green color wavelength bandwidth and a blue color filter 107B for transmitting a blue color wavelength bandwidth. Hereinafter, the red color filter 107R, the green color filter 107G and the blue color filter 107B are collectively referred to as color filters 107.

Types (transmission wavelengths) of the color filters 107 are not limited to the above three colors. A material for each color filter 107 is not especially limited and may be any known material. As shown in FIG. 1, the color filter 107 having one transmission wavelength of the three can be disposed on an upper layer of each photoelectric conversion element 106. In this manner, light having the specific wavelength bandwidth transmitting through an upper layer of the color filter 107 is incident on each photoelectric conversion element 106. An output therefrom can be a light intensity at the wavelength bandwidth transmitted through the color filter 107.

The color filter layer 102 may not be disposed. When no color filter layer 102 is disposed, a monochrome image is generated from the output of each photoelectric conversion element. In this case, the on-chip lenses 103 can be disposed on the photoelectric conversion layer 101 or can be disposed via any layer.

The on-chip lenses 103 are formed on the color filter layer 102 and collect incident light on the photoelectric conversion elements 106 via the color filters 107. The on-chip lenses 103 can be formed corresponding to each photoelectric conversion elements 106 as shown in FIG. 1, but one on-chip lens 103 may be formed corresponding to a plurality of the photoelectric conversion elements 106.

Each on-chip lenses 103 are made of a high refractive index material having a light transmission property, and can have a hemispherical shape or any shape of acting as a lens. In this manner, light incident on the on-chip lenses 103 from the low refractive index layer 104 having a refractive index lower than the on-chip lenses 103 is refracted at an interface between the low refractive index layer 104 and the on-chip lenses 103 and is collected on the photoelectric conversion elements 106 corresponding to the respective on-chip lenses 103.

The low refractive index layer 104 is formed flat on the on-chip lenses 103. In other words, lens shapes (hemispherical shapes etc.) of the on chip lenses 103 are buried into the low refractive index layer 104. The low refractive index layer 104 can be made of the material having a refractive index at least lower than those of the on-chip lenses 103 and having the light transmitting property. The greater a refractive index difference between the low refractive index layer 104 and the on-chip lenses 103 is, the greater a lens effect by the on-chip lenses 103 is. It is preferable.

The infrared absorption layer 105 is laminated on the low refractive index layer 104 and removes infrared components from light incident on the image capturing element 100. As described above, as the low refractive index layer 104 is formed flat, the infrared absorption layer 105 can be laminated at a uniform thickness regardless of the shapes of the on-chip lenses 103. The infrared absorption layer 105 is preferably made of a material highly absorbing infrared components and having high transmittance of visible light. A detail of such a material will be described later.

Preferably, the infrared absorption layer 105 has 1 μm to 200 μm. In the image capturing element 100 according to the embodiment, the thickness of the infrared absorption layer 105 does not affect the distance between each of the on-chip lenses 103 and each of the photoelectric conversion elements 106, whereby the infrared absorption layer 105 can have the thickness sufficient to remove the infrared components.

[Operation of Image Capturing Element]

Figure 2:
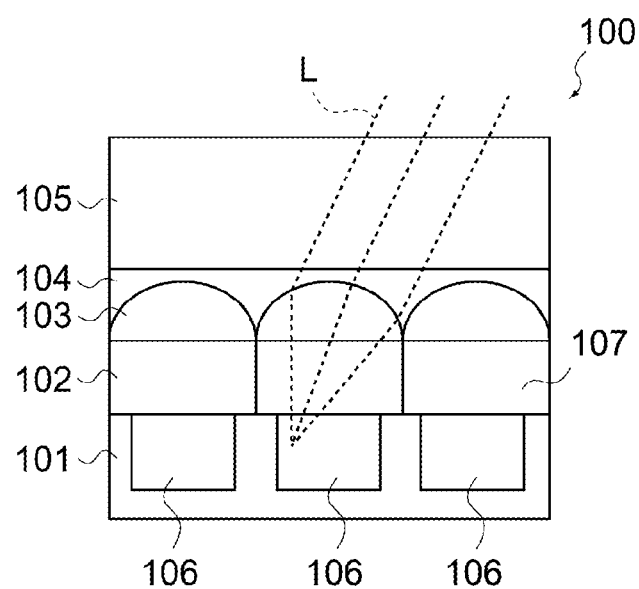
FIG. 2 A schematic diagram showing an operation of the image capturing element.

An operation of the image capturing element 100 having the above-described configuration will be described. FIG. 2 is a schematic diagram showing incident light (shown as incident light L) on the image capturing element 100. As shown in the same figure, the incident light L is transmitted through the infrared absorption layer 105, the low refractive index layer 104, the on-chip lenses 103 and the color filter layer 102 and reaches the photoelectric conversion elements 106.

The components at an infrared wavelength bandwidth (hereinafter referred to as infrared components) included in the incident light L are removed by the infrared absorption layer 105. The incident light L is refracted by the interface between the low refractive index layer 104 and the on-chip lenses 103 and is collected towards the photoelectric conversion elements 106. The components at a bandwidth other than the transmission wavelength bandwidth of the color filters 107 are removed by the color filter layer 102. The light is photoelectrically converted by the photoelectric conversion elements 106.

[Effects of Image Capturing Element]

Figure 3:
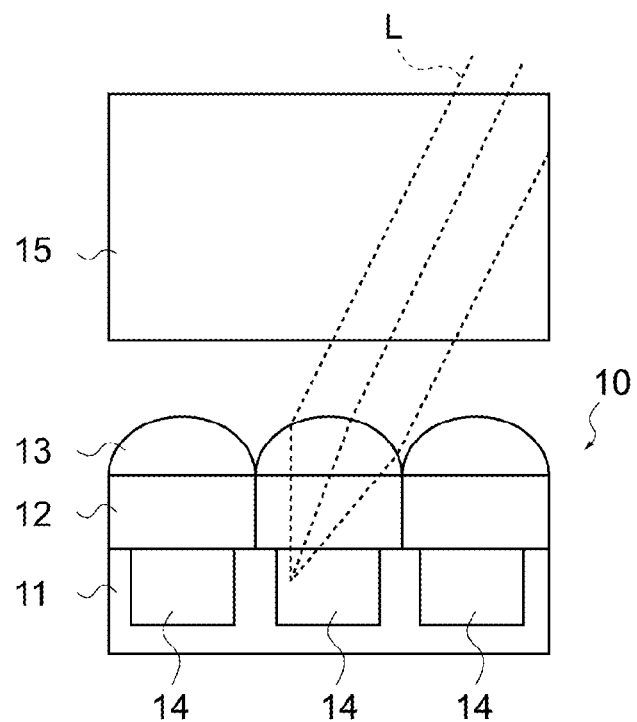
FIG. 3 A schematic diagram showing an operation of an image capturing element according to a comparative embodiment.
Figure 4:
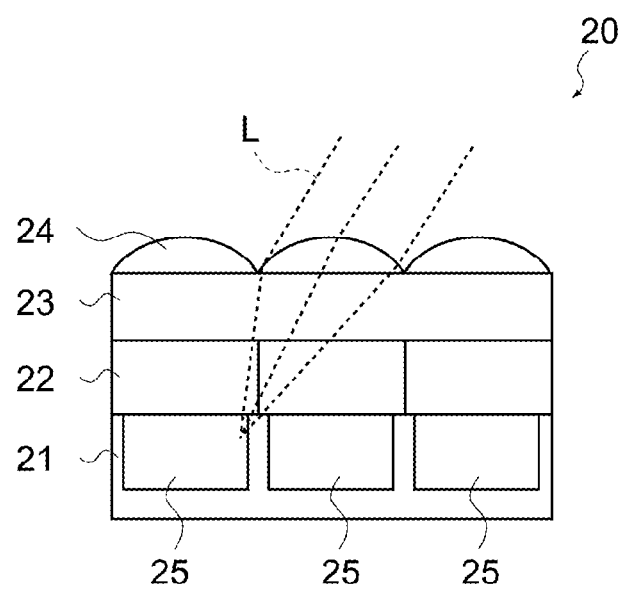
FIG. 4 A schematic diagram showing an operation of an image capturing element according to a comparative embodiment.
Figure 5:
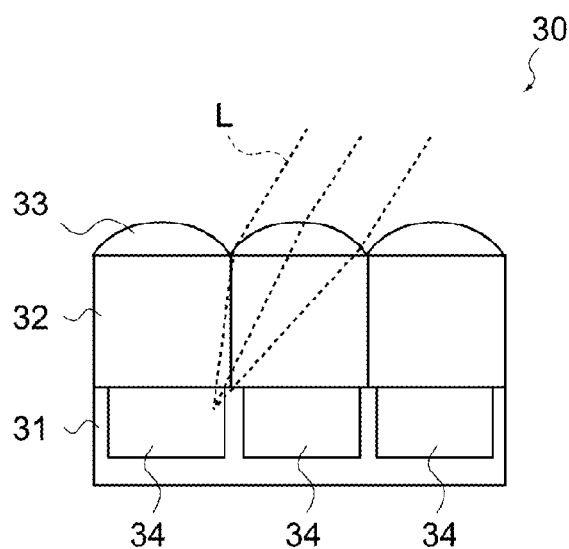
FIG. 5 A schematic diagram showing an operation of an image capturing element according to a comparative embodiment.

Effects of the image capturing element 100 according to the embodiment will be described by comparing to those in comparative embodiments. FIGS. 3 to 5 are schematic diagrams showing image capturing elements in the related art according to comparative embodiments.

FIG. 3 is a schematic diagram showing an image capturing element 10 according to a comparative embodiment. The image capturing element 10 is configured of a photoelectric conversion layer 11, a color filter layer 12, on-chip lenses 13 laminated in this order. A plurality of photoelectric conversion elements 14 are formed in the photoelectric conversion layer 11. As shown in the same figure, the image capturing element 10 cannot alone prevent the infrared components from entering into the photoelectric conversion elements 14.

Accordingly, the image capturing element 10 should be mounted to the image capturing apparatus (not shown) together with an infrared cut filter 15. The infrared cut filter 15 may be an infrared absorption filter made of an infrared absorption material or may be a multilayer film filter where a number of high refractive index materials and a plurality of low refractive index materials are laminated alternately.

As shown in FIG. 3, the incident light L is transmitted through the infrared cut filter 15, is incident on the image capturing element 10, is transmitted through the on-chip lenses 13 and the color filter layer 12 and reaches the photoelectric conversion elements 14. Here, the infrared cut filter 15 should be mounted to the image capturing apparatus separately from the image capturing element 10, as described above. The infrared cut filter 15 needs a predetermined thickness (about 1 to 3 mm) for maintaining the strength. Accordingly, with the infrared cut filter 15, it is difficult to thin the image capturing optical system.

In contrast, in the image capturing element 100 according to the embodiment shown in FIG. 2, as the infrared components of the incident light L are removed by the infrared absorption layer 105, there is no need to dispose the infrared cut filter separately from the image capturing element 100 and it is possible to thin the image capturing system.

FIG. 4 and FIG. 5 each is a schematic diagram showing an image capturing element according to another comparative embodiment.

An image capturing element 20 (corresponding to Patent Document 1) according to comparative embodiment shown in FIG. 4 is configured of a photoelectric conversion layer 21, a color filter layer 22, an infrared absorption layer 23 and on-chip lenses 24 laminated in this order. A plurality of photoelectric conversion elements 25 are formed in the photoelectric conversion layer 21. The infrared absorption layer 23 is composed of an infrared absorption material.

As the image capturing element 20 has the infrared absorption layer 23, no infrared cut filter separately from the image capturing element 20 is needed different from the above-described image capturing element 10, and it is possible to thin the image capturing optical system. However, the configuration of the image capturing element 20 may cause the following problem.

As shown in FIG. 4, the incident light L is collected by the on-chip lenses 24, is transmitted through the infrared absorption layer 23 and the color filter layer 22 and reaches a photoelectric conversion elements 25. Here, by the presence of the infrared absorption layer 23 formed between the on-chip lenses 24 and the color filter layer 22, a distance between each of the on-chip lenses 24 and each of the photoelectric conversion elements 25 is great. This is because the infrared absorption layer 23 needs a predetermined thickness for providing a sufficient infrared absorption ability. Here, curvature of the on-chip lenses 24 is adjusted so that the light is collected just at the positions of the photoelectric conversion elements 25 as the distance between each of the on-chip lenses 24 and each of the photoelectric conversion elements 25 is great.

In this manner, as shown in FIG. 4, the incident light L incident on the on-chip lenses 24 with some angles may be incident not on the photoelectric conversion elements 25 corresponding to the on-chip lenses 24 but on the photoelectric conversion elements 25 adjacent thereto. This may cause a degraded pixel resolution and a degraded color separation.

An image capturing element 30 (corresponding to Patent Document 2) according to comparative embodiment shown in FIG. 5 is configured of a photoelectric conversion layer 31, a color filter/infrared absorption layer 32 and on-chip lenses 33 laminated in this order. A plurality of photoelectric conversion elements 34 are formed in the photoelectric conversion layer 31. The color filter/infrared absorption layer 32 has combined functions of the color filter and the infrared absorption.

As the image capturing element 30 has the color filter/infrared absorption layer 32, there is no need to dispose the infrared cut filter separately from the image capturing element 30 and it is possible to thin the image capturing system similar to the image capturing element 20. However, the color filter/infrared absorption layer 32 also needs a predetermined thickness for providing a sufficient infrared absorption ability. Accordingly, similar to the case of the image capturing element 20, the incident light to the on-chip lenses 33 may be undesirably incident not on the photoelectric conversion elements 34 corresponding to the on-chip lenses 33 but on the photoelectric conversion elements 34 adjacent thereto. Here, curvature of the on-chip lenses 24 is adjusted so that the light is collected just at the positions of the photoelectric conversion elements 25 as the distance between each of the on-chip lenses 24 and each of the photoelectric conversion elements 25 is great.

In contrast, in the image capturing element 100 according to the embodiment shown in FIG. 2, the infrared absorption layer 105 is formed above the on-chip lenses 103. Regardless of the thickness of the infrared absorption layer 105, the distance between each of the on-chip lenses 103 and each of the photoelectric conversion elements 106 are similar to the related art structure (the image capturing element 10, see FIG. 3). Dissimilar to the image capturing element 20 and the image capturing element 30 according to the comparative embodiments, the incident light L will be not incident on the photoelectric conversion elements 106 adjacent thereto and no problem is generated. In other words, in the image capturing element 100 according to the embodiment, it is possible to thin the image capturing optical system without decreasing image capturing performances (resolution, etc.) of the image capturing element 100.

[About Infrared Absorption Material]

As described above, the infrared absorption layer 105 of the image capturing element 100 is made of the infrared absorption material having the infrared absorption ability. The infrared absorption material of the infrared absorption layer 105 preferably has a heating yellowing temperature (the temperature at which the infrared absorption material is degraded and yellowed) of 180° C. or more. This is because the infrared absorption layer 105 is included in the image capturing element 100 unlike in the case of the comparative embodiment where the infrared cult filter 15 is disposed separately from the image capturing element 10. In other words, even if the infrared absorption layer 105 is exposed to high temperature during a manufacturing process or operation of the image capturing element 100, the material not yellowed is a preferable infrared absorption material.

The infrared absorption material includes at least an infrared absorption pigment (wavelength-selective absorption pigment). The infrared absorption pigment may be mixed with a binder resin or may contain additives (a leveling agent, a dispersant etc.).

(Infrared Absorption Pigment)

Preferably, the infrared absorption pigment has a maximum absorption wavelength of 600 nm to 1200 nm and has a molar absorbance coefficient of 1000 L/mol·cm or more. In addition, in order to ensure a visible light transmission property, it is desirable that a ratio of the molar absorbance coefficients of the maximum absorption wavelengths in an infrared region and a visible region of the pigment is 0.1 or more.

Furthermore, the infrared absorption pigment preferably has a decomposition temperature of 180° C. or more. As described above, even if the infrared absorption layer 105 is exposed to high temperature during a manufacturing process or operation of the image capturing element 100, the infrared absorption ability should not be lost. Note that the decomposition temperature of the infrared absorption pigment can be improved by the additives as described later. Two types or more of the infrared absorption pigments may be contained in the infrared absorption material. Any combination of the infrared absorption pigments can be selected to have a spectroscopy property suitable to capture an image, as appropriate.

Specifically, the infrared absorption pigment has a main framework of a dithiol complex, an aminothiol complex, phthalocyanine, naphthalocyanine, phosphoric ester copper complex, a nitroso compound and a metal complex thereof, for example. The metal of the complex can be selected from iron, magnesium, nickel, cobalt, copper, vanadium zinc, palladium, platinum, titanium, indium and tin. Also, oxides such as titanyl and vanadyl can be selected. The elements in ligands can be selected from organic ligands such as halogens, an amine group, a nitro group and a thiol group. In addition, a substituent group such as an alkyl group, a hydroxyl group, a carboxyl group, an amino group, a nitro group, a cyano group, an alkyl fluoride group and ether may be introduced.

Examples of the infrared absorption pigment include an organic compound such as a methine dye such as cyanine and Merocyanine, a triaryl methane, squarylium, anthraquinone, naphthoquinone, quaterrylene, perylene, styIyl, immonium, diimmonium, croconium, oxanol and an aminium salt. Into the respective organic compounds, a substituent group such as an alkyl group, a hydroxyl group, a carboxyl group, an amino group, a nitro group, a cyano group, an alkyl fluoride group and ether may be introduced.

Further examples of the infrared absorption pigment include a metal oxide such as ITO (Indium Tin Oxide), AZO (Al doped zinc oxide), tungsten oxide, antimony oxide and cesium tungsten. These metal oxides may be a film or a particulate motionless substance.

Among them, a preferable infrared absorption pigment contained in the infrared absorption layer 105 is the metal complex, quaterrylene, perylene and the metal oxides that have a high decomposition temperature.
(Binder Resin)

The binder resin may be a high molecular weight material or a lower molecular weight material. The high molecular weight material preferably has a decomposition temperature of 180° C. or more and a Tg (glass transfer temperature) of 180° C. or more and more preferably has an Mp (melting point) of 180° C. or more. Most preferably, the heating yellowing temperature is 180° C. or more. This allows the infrared absorption ability of the infrared absorption material and the visible light transmission property to be prevented from degrading.

The low molecular weight material is cross-linked by heating after a film formation or by irradiating ultraviolet rays. After the cross-linking reaction, a high molecular weight material is generated. The high molecular weight material preferably has a decomposition temperature of 180° C. or more and a Tg of 180° C. or more and more preferably has an Mp of 180° C. or more. Most preferably, the heating yellowing temperature is 180° C. or more. This allows the infrared absorption ability of the infrared absorption material and the visible light transmission property to be prevented from degrading.

When the cross-linking reaction is needed, a cross-linking agent and a reaction initiator (such as a photopolyemrization initiator and a thermal polymerization initiator) as reaction aids may be needed. The reaction aids are selected depending on the low molecular weight material (monomer) as appropriate. Preferably, any of the high molecular weight material, the low molecular weight material and the reaction aids has no maximum absorption wavelengths in 400 to 600 nm (visible light wavelength bandwidth).

Even when the heating yellowing of the binder resin is less than 180° C., oxide particulates may be mixed with the resin such that the heating yellowing is improved. Note that the oxide particulates correspond to additives as described below.

Specifically, the binder resin may have an end structure of epoxy, acryl or vinyl. Preferably, a framework of a main chain thereof has silicone, polycarbonate, polyethylene sulfone, polyimide, norbornene, other multifunctional polymers (preferably, three functionalities or more) polysaccharides or a cellulose structure as they have a high heating yellowing temperature.
(Additives)

Examples of the additives include a levelling agent, a dispersion auxiliary (surfactant etc.), an antioxidant and a pigment stabilizer. Preferably, the additives have no maximum absorption wavelengths in the visible light wavelength bandwidth of 400 to 600 nm. Furthermore, the additives preferably has a decomposition temperature of 180° C. or more. Especially when the stabilizer and the antioxidant for the infrared absorption pigment are used, these additives may increase the heating yellowing of the infrared absorption material over 180° C. even if the decomposition temperatures of the infrared absorption pigment and the binder resin exceed 180° C. In this case, the decomposition temperatures of the infrared absorption pigment and the binder resin are not necessarily 180° C. or more.

As described above, the infrared absorption material of the infrared absorption layer 105 can be composed of the infrared absorption pigment, the binder resin and the additives added optionally. Note that the infrared absorption layer 105 should be sufficiently adhered to the low refractive index layer 104 as a lower layer and should not be cracked, opaque or peeled by heating. Adhesiveness of the infrared absorption layer 105 depends on adhesiveness of the pigment material when the infrared absorption pigment is a single component. Adhesiveness of the infrared absorption layer 105 depends on adhesiveness of the binder resin when the binder resin is a main component of the infrared absorption material. If no sufficient adhesiveness is provided by the infrared absorption pigment or the binder resin, the additives may be used to improve the adhesiveness.

The infrared absorption layer 105 can be formed by film-forming the above-described infrared absorption material on the low refractive index layer 104 using a film formation method such as a vapor deposition method, a sputtering method or a coating method. In particular, a preferable method is to form the infrared absorption layer 105 having a uniform thickness.
[Combination with Infrared Cut Filter]

Figure 6:
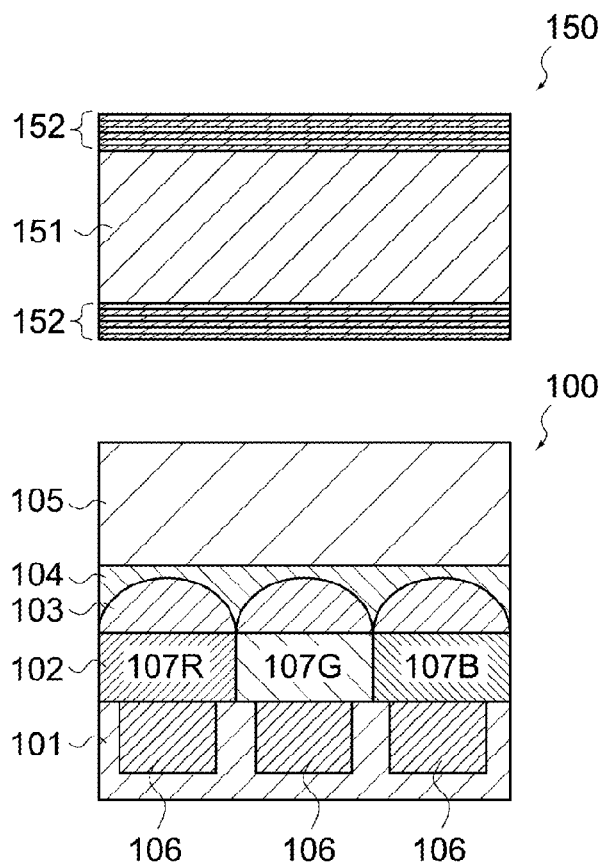
FIG. 6 A schematic diagram showing an image capturing element and an infrared cut filter according to the first embodiment of the present technology.

The image capturing element 100 according to the embodiment can be used together with an infrared cut filter. FIG. 6 is a schematic diagram showing an infrared cut filter 150 mounted together with the image capturing element 100. As shown in the same figure, the infrared cut filter 150 can be a multilayer film infrared cut filter.

Specifically, the infrared cut filter 150 can be composed of multilayer films 152 formed on both surfaces of a support substrate 151. In each multilayer film 152, the layers made of the high refractive index material and the layers made of the low refractive index material are laminated alternately. By light interference between the layers, only the infrared components are reflected and the visible light is transmitted. Note that the infrared cut filter 150 is not limited to the multilayer film infrared cut filter and may be the one that can remove the infrared components by other theory.

By using the image capturing element 100 together with the infrared cut filter 150, the infrared absorption layer 105 of the image capturing element 100 and the infrared cut filter 150 can compensate their transmission wavelength bandwidths each other (described later). As an infrared removal amount can be shared by the both, the infrared absorption layer 105 can be thin.

Second Embodiment

Figure 7:
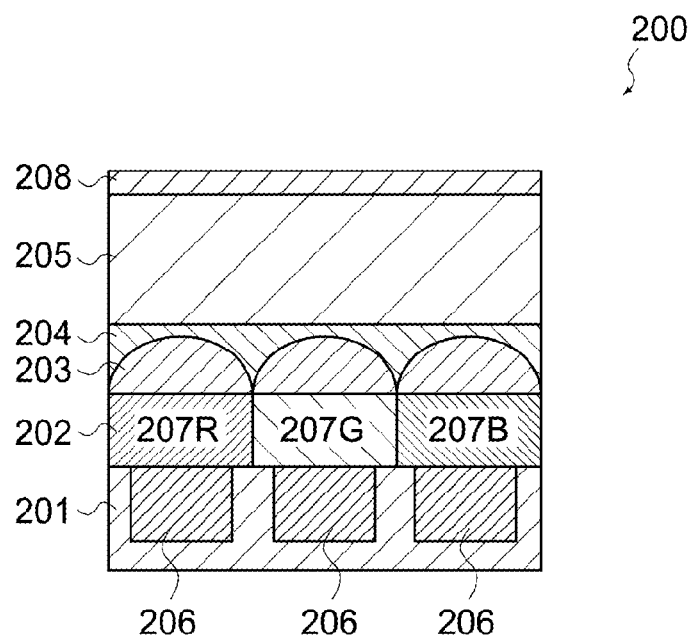
FIG. 7 A schematic diagram of an image capturing element according to a second embodiment of the present technology.

An image capturing element according to the second embodiment of the present technology will be described.
[Structure of Image Capturing Element]
FIG. 7 is a schematic diagram of an image capturing element 200 according to the embodiment of the present technology. As shown in the same figure, the image capturing element 200 is configured of a photoelectric conversion layer 201, a color filter layer 202, on-chip lenses 203, a low refractive index layer 204, an infrared absorption layer 205 and antireflection layer 208 laminated.

The photoelectric conversion layer 201, the color filter layer 202, the on-chip lenses 203, the low refractive index layer 204 and the infrared absorption layer 205 can have the structures similar to those in the first embodiment. A plurality of photoelectric conversion elements 206 is formed in the color filter layer 201. The color filter layer 202 has a red color filter 207R, a green color filter 207G and a blue color filter 207B (hereinafter collectively referred to as color filters 207) corresponding to each photoelectric conversion element 206.

The antireflection layer 208 is laminated on the infrared absorption layer 205 as an uppermost layer of the image capturing element 200, and prevents incident light from above and incident light from a lower layer (the infrared absorption layer 205) side from being reflected. The incident light on the image capturing element 200 is transmitted through the antireflection layer 208, the infrared absorption layer 205, the low refractive index layer 204, is collected by the on-chip lenses 203, is transmitted through the color filter layer 202 and reaches the photoelectric conversion elements 206. Here, a part of the incident light is reflected at each interface between the layers and may proceed to at an upper layer side as a reflected light.

If the antireflection layer 208 is not disposed, the reflected light from a lower layer side is reflected again at an interface between the infrared absorption layer 205 and air and is incident on other photoelectric conversion element 206, which may result in a degraded pixel resolution. Here, by the antireflection layer 208, the reflected light is prevented from reflecting again at the interface between the infrared absorption layer 205 and air, thereby preventing the reflected light from reaching other photoelectric conversion element 206.

The antireflection layer 208 can be composed of any material for decreasing an optical reflectance generated at the interface between air and the infrared absorption layer 205. When the antireflection layer is composed of a physically or chemically strong material, the antireflection layer 208 can be used as a protective layer of the lower layer. Alternatively, a protective layer for protecting the infrared absorption layer 205 may be disposed separately from the antireflection layer 208 between the infrared absorption layer 205 and the antireflection layer 208.

Third Embodiment

Figure 8:
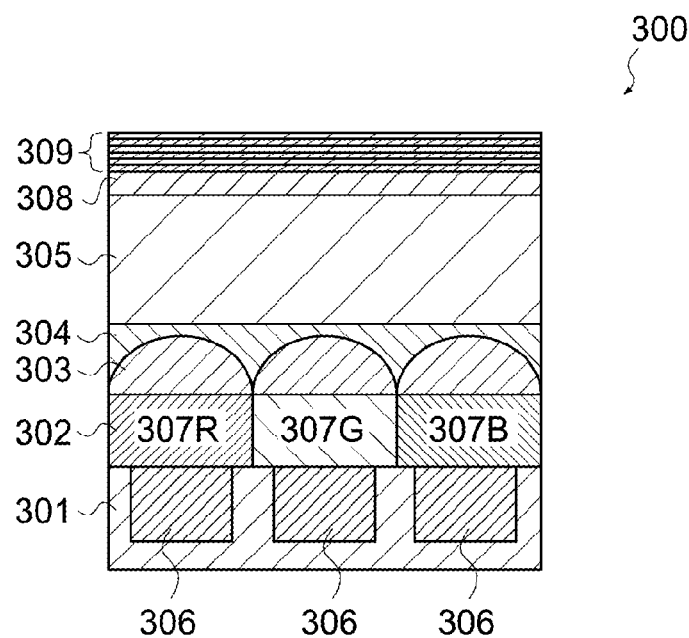
FIG. 8 A schematic diagram of an image capturing element according to a third embodiment of the present technology.

An image capturing element according to a third embodiment of the present technology will be described.
[Structure of Image Capturing Element]
FIG. 8 is a schematic diagram of an image capturing element 300 according to the embodiment of the present technology. As shown in the same figure, the image capturing element 300 is configured of a photoelectric conversion layer 301, a color filter layer 302, on-chip lenses 303, a low refractive index layer 304, an infrared absorption layer 305, a protective layer 308 and a multilayer film infrared reflection layer 309 laminated.

The photoelectric conversion layer 301, the color filter layer 302, the on-chip lenses 303, the low refractive index layer 304 and the infrared absorption layer 305 can have the structures similar to those in the first embodiment. A plurality of photoelectric conversion elements 306 is formed in the color filter layer 301. The color filter layer 302 has a red color filter 307R, a green color filter 307G and a blue color filter 307B (hereinafter collectively referred to as color filters 307) corresponding to each photoelectric conversion element 306.

The protective layer 308 is laminated on the infrared absorption layer 305 and protects the infrared absorption layer 305. As shown in FIG. 8, the multilayer film infrared reflection layer 309 can be laminated on the infrared absorption layer 305 via the protective layer 308. Depending on the method of laminating the multilayer film infrared reflection layer 309, the protective layer 308 may not be disposed. For example, the protective layer 308 may be composed of silicon dioxide.

The multilayer film infrared reflection layer 309 is laminated on the protective layer 308 and removes the infrared components contained in the incident light. In the multilayer film infrared reflection layer 309, the layers made of the high refractive index material and the layers made of the low refractive index material are laminated alternately. By light interference between the layers, only the infrared components are reflected and the visible light is transmitted.

The image capturing element 300 includes the infrared absorption layer 305 in addition to the multilayer film infrared reflection layer 309. In the embodiment, the both can prevent the infrared components from reaching the photoelectric conversion elements 306.

Figure 9:
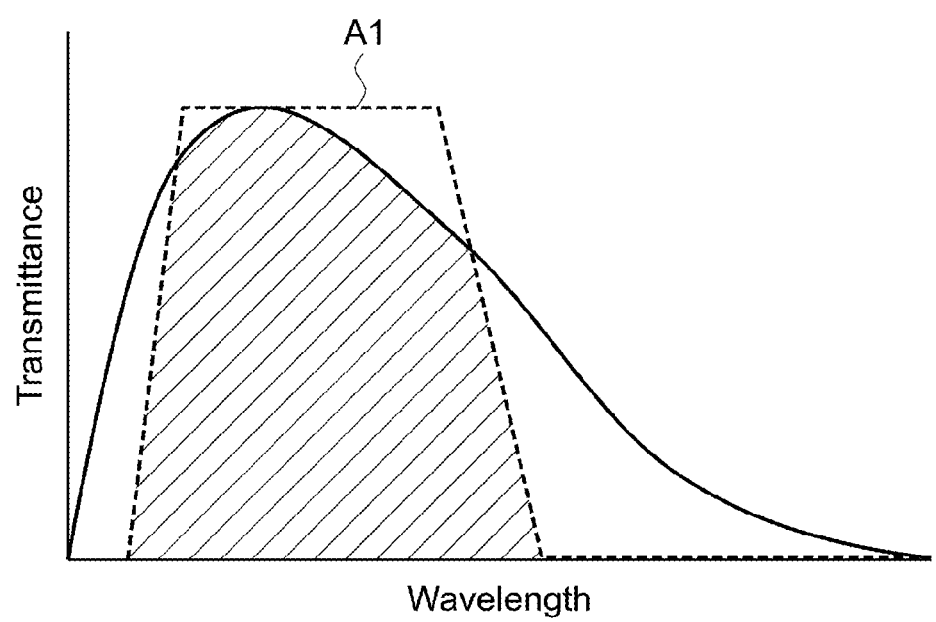
FIG. 9 A graph showing a transmission spectroscopy property of an infrared absorption layer in the image capturing element.
Figure 10:
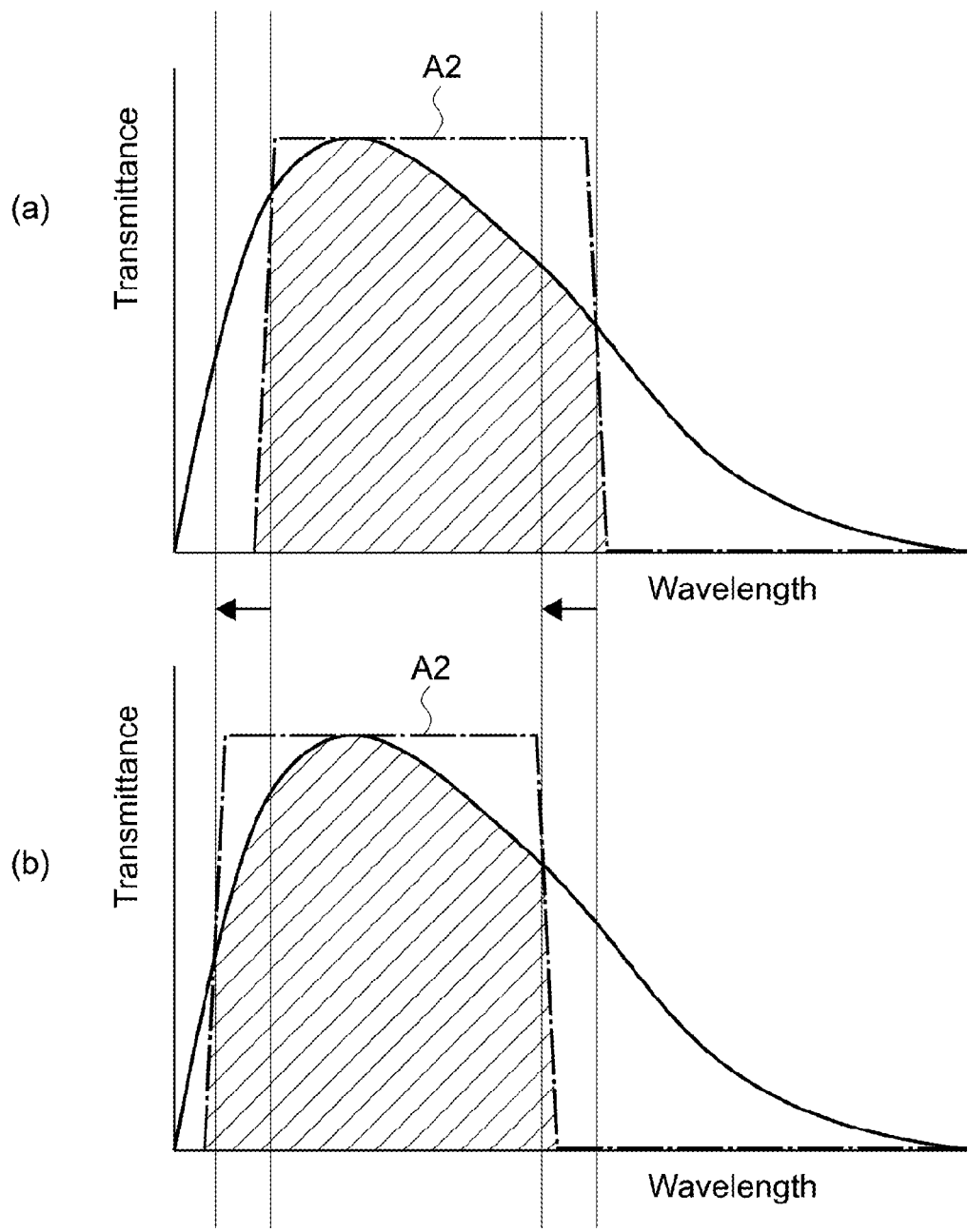
FIG. 10 Graphs each showing a transmission spectroscopy property of a multilayer film infrared reflection layer in the image capturing element.
Figure 11:
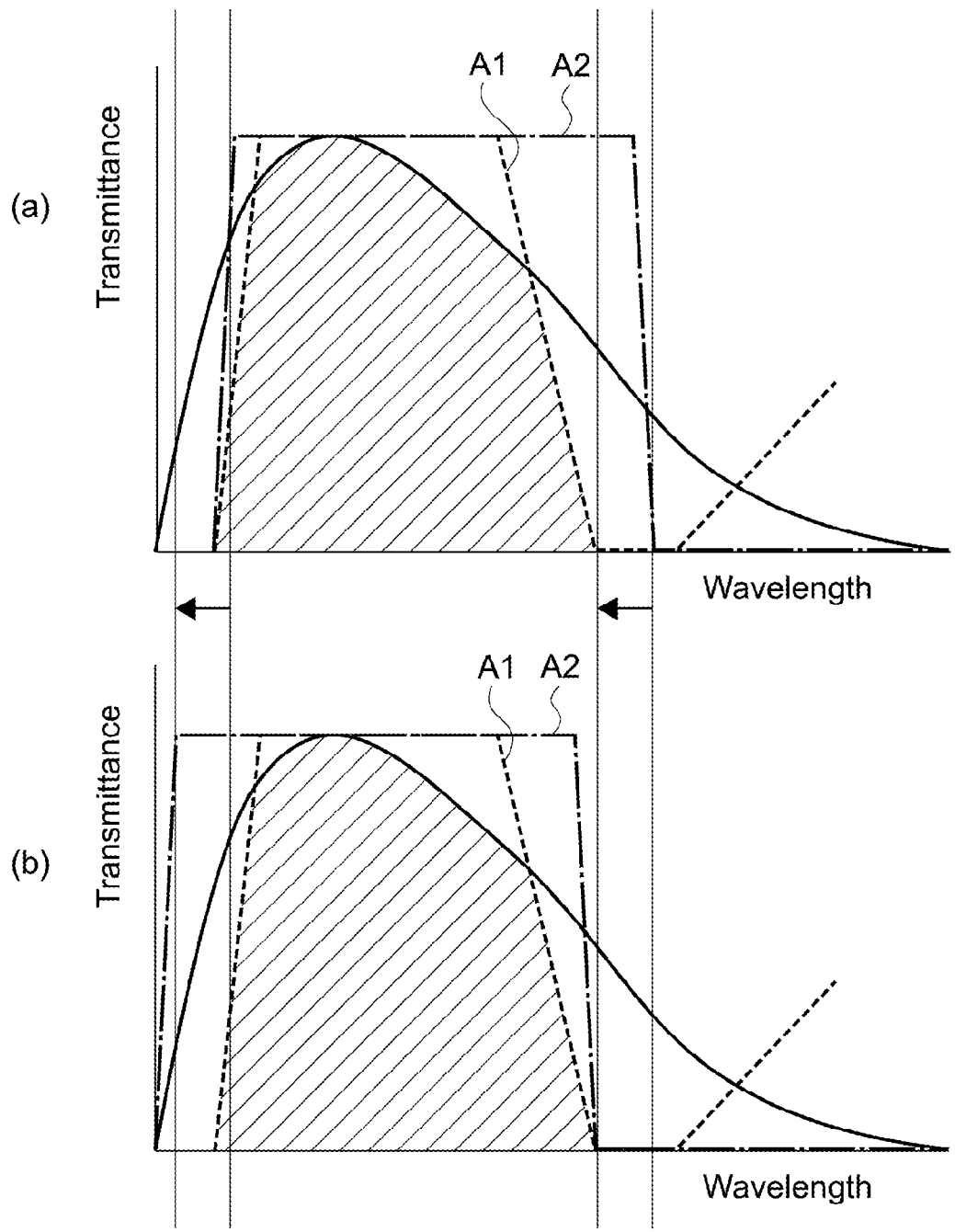
FIG. 11 Graphs each showing a transmission spectroscopy property of an infrared absorption layer and a multilayer film infrared reflection layer in the image capturing element.

FIGS. 9 to 11 are graphs showing transmission spectroscopy properties of the multilayer film infrared reflection layer 305 and the infrared absorption layer 390. FIG. 9 shows a transmission wavelength bandwidth A1 of the infrared absorption layer 305 alone and a transmission spectroscopy property of the photoelectric conversion elements 306, and shows that the light included in the transmission wavelength bandwidth of the infrared absorption layer 305 (a shaded area in the figure) is not absorbed by the infrared absorption layer 305 and is detected by the photoelectric conversion elements 306.

FIG. 10 each shows a transmission wavelength bandwidth A2 of the multilayer film infrared reflection layer 309 alone and the transmission spectroscopy property of the photoelectric conversion elements 306. FIG. 10(a) shows the case that a light incident angle to the image capturing element 300 is 0 degree (the direction perpendicular to the layer) and FIG. 10(b) shows the case that the light incident angle is 30 degrees (30 degrees from the direction perpendicular to the layer). As shown in FIGS. 10(a) and 10(b), the transmission wavelength bandwidth A2 of the multilayer film infrared reflection layer 309 is shifted to a short wavelength side depending on the light incident angle. This is because the multilayer film infrared reflection layer 309 utilizes the light interference by the multilayer film and an optical path length is changed depending on the incident angle.

If the infrared components are removed only by the multilayer film infrared reflection layer 309, the following problem arises. In recent years, as the image capturing apparatus gets thinner, a focal length of the image capturing lens tends to be shortened. The image capturing lens having the short focal length has a shorter eye relief length as well. The incident angle at a peripheral angle of view (a rim of the photoelectric conversion layer 301) is greater than that at a center angle of view (a center of the photoelectric conversion layer 301). Accordingly, the transmission wavelength of the multilayer film infrared reflection layer 309 is varied depending on the position of the photoelectric conversion layer 301 in the photoelectric conversion elements 306. Thus, an in-plane uniformity will be degraded where a color reproducibility is changed depending on a position of a captured image.

On the other hand, FIG. 11 each shows the transmission wavelength bandwidth A1 (A1 may have the transmittance at a long wavelength side) of the infrared absorption layer 305, the transmission wavelength bandwidth A2 of the multilayer film infrared reflection layer 309, and the transmission spectroscopy property of the photoelectric conversion elements 306. FIG. 11(a) shows the case that a light incident angle to the image capturing element 300 is 0 degree (the direction perpendicular to the layer) and FIG. 11(b) shows the case that the light incident angle is 30 degrees (30 degrees from the direction perpendicular to the layer). As shown in FIGS. 11(a) and 11(b), due to a difference in the light incident angle to the image capturing element 300, even if the transmission wavelength bandwidth A2 of the multilayer film infrared reflection layer 309 is shifted, the transmission wavelength bandwidth can be maintained by the transmission wavelength bandwidth A1 of the infrared absorption layer 305.

As described above, in the image capturing element 300 of the embodiment, the multilayer film infrared reflection layer 309 and the infrared absorption layer 305 are used together, thereby preventing the transmission wavelength bandwidth from changing by the light incident angle. In addition, as a predetermined amount of the infrared components can be removed by the multilayer film infrared reflection layer 309, the infrared absorption layer 305 can be thin.

Fourth Embodiment

Figure 12:
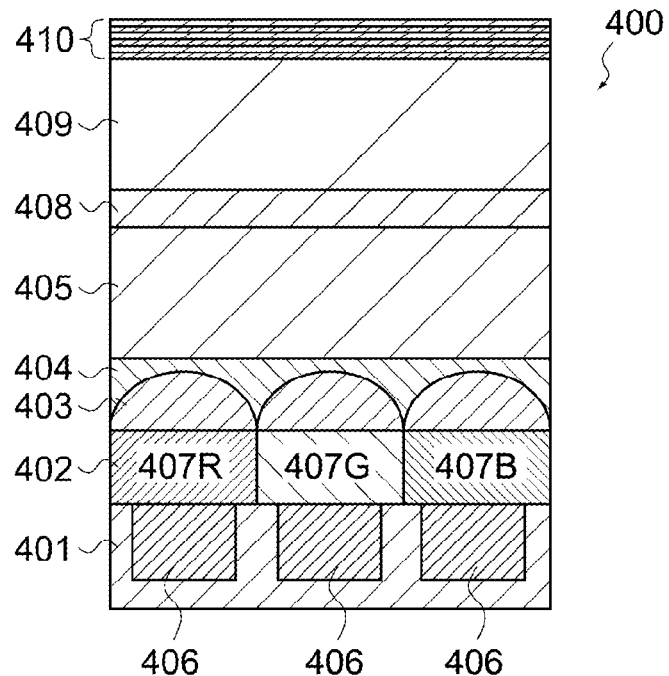
FIG. 12 A schematic diagram of an image capturing element according to a fourth embodiment of the present technology.

An image capturing element according to a fourth embodiment of the present technology will be described.
[Structure of Image Capturing Element]
FIG. 12 is a schematic diagram of an image capturing element 400 according to the embodiment of the present technology. As shown in the same figure, the image capturing element 400 is configured of a photoelectric conversion layer 401, a color filter layer 402, on-chip lenses 403, a low refractive index layer 404, an infrared absorption layer 405, an adhesion layer 408, a support substrate 409 and a multilayer film infrared reflection layer 410 laminated.

The photoelectric conversion layer 401, the color filter layer 402, the on-chip lenses 403, the low refractive index layer 404 and the infrared absorption layer 405 can have the structures similar to those in the first embodiment. A plurality of photoelectric conversion elements 406 is formed in the color filter layer 401. The color filter layer 402 has a red color filter 407R, a green color filter 407G and a blue color filter 407B (hereinafter collectively referred to as color filters 207) corresponding to each photoelectric conversion element 406.

The adhesion layer 408 is laminated on the infrared absorption layer 405 to adhere the infrared absorption layer 405 to the support substrate 409. The adhesion layer 408 can be composed of any material having an adhesion property, for example, of a synthetic resin, desirably having a high light transmission property.

The support substrate 409 is laminated on the adhesion layer 408 and supports the multilayer film infrared reflection layer 410. The support substrate 409 can be a plate-like member having a certain level of strength and can be composed of a material having a high light transmission property such as glass.

The multilayer film infrared reflection layer 410 is laminated on the support substrate 409 and removes the infrared components of the incident light.

In the multilayer film infrared reflection layer 410, the layers made of the high refractive index material and the layers made of the low refractive index material are laminated alternately similar to the third embodiment.

With such a configuration, the support substrate 409 on which the multilayer film infrared reflection layer 410 is formed and the laminate from the photoelectric conversion layer 401 to the infrared absorption layer 405 are separately prepared and are adhered by the adhesion layer 408 to produce the image capturing element 400. A typical apparatus for manufacturing an image capturing element has often no function to form a multilayer film. It is therefore difficult to produce the image capturing element having the multilayer film by the typical apparatus for manufacturing an image capturing element.

With the configuration of the image capturing element 400 according to the embodiment, it is possible to form the multilayer film infrared reflection layer 410 and the laminate of lower layers (from the photoelectric conversion layer 401 to the infrared absorption layer 405) separately. In this manner, the image capturing element 400 can be produced using the existing production apparatus and the multilayer film forming apparatus without introducing a new production apparatus and no significant remodeling.

Fifth Embodiment

Figure 13:
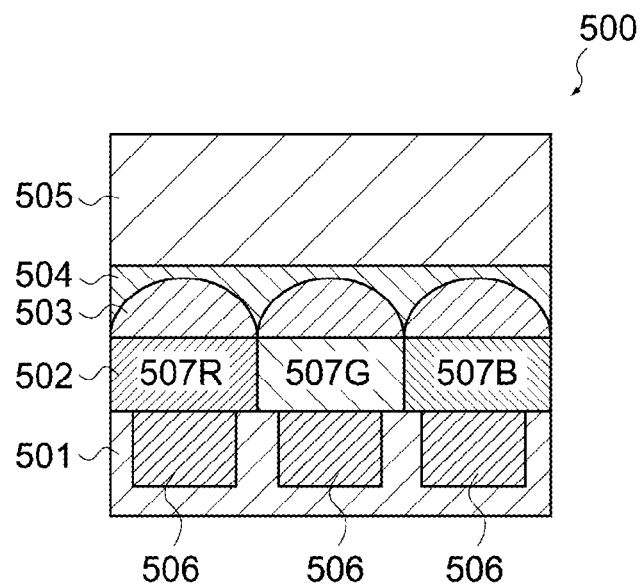
FIG. 13 A schematic diagram of an image capturing element according to a fifth embodiment of the present technology.

An image capturing element according to a fifth embodiment of the present technology will be described.
[Structure of Image Capturing Element]
FIG. 13 is a schematic diagram of an image capturing element 500 according to the embodiment. As shown in the same figure, the image capturing element 500 is configured of a photoelectric conversion layer 501, a color filter layer/ infrared absorption layer 502, on-chip lenses 503, a low refractive index layer 504 and an infrared absorption layer 505 laminated.

The photoelectric conversion layer 501, the on-chip lenses 503, the low refractive index layer 504 and the infrared absorption layer 505 can have the structures similar to those in the first embodiment. A plurality of photoelectric conversion elements 506 is formed in the color filter layer 501.

The color filter/infrared absorption layer 502 is laminated on the photoelectric conversion layer 501, functions as the color filters and also has an infrared absorption ability. Specifically, the infrared absorption pigment as described in the first embodiment can be mixed with each color filters corresponding to each photoelectric conversion element 506. As shown in FIG. 13, the color filter/infrared absorption layer 502 may include a red color filter/infrared absorber 507R, a green color filter/infrared absorber 507G and a blue color filter/infrared absorber 507B. Hereinafter, these are collectively referred to as color filters/infrared absorbers 507. Note that the transmission colors of the color filters/infrared absorbers 507 are not limited to the above three colors.

In the image capturing element 500, the infrared components of the incident light can be removed by the color filter/infrared absorption layer 502 as well as the infrared absorption layer 505. In this manner, both of them can be thinned as compared to the case that either of them is disposed.

Like the above-described image capturing element 30 according to the comparative embodiment (see FIG. 5), when the infrared components is removed only by the color filter/infrared absorption layer 32, it is hard to avoid increasing the thickness and light is undesirably incident on other photoelectric conversion element. In contrast, in the image capturing element 500, there is no need to increase the thickness of the color filter/infrared absorption layer 502 and there is no problem that light is incident on other photoelectric conversion element. In addition, the image capturing element 500 can sufficiently remove the infrared components of the incident light by the two infrared absorption layers of the infrared absorption layer 505 and the color filter/infrared absorption layer 502.

Sixth Embodiment

Figure 14:
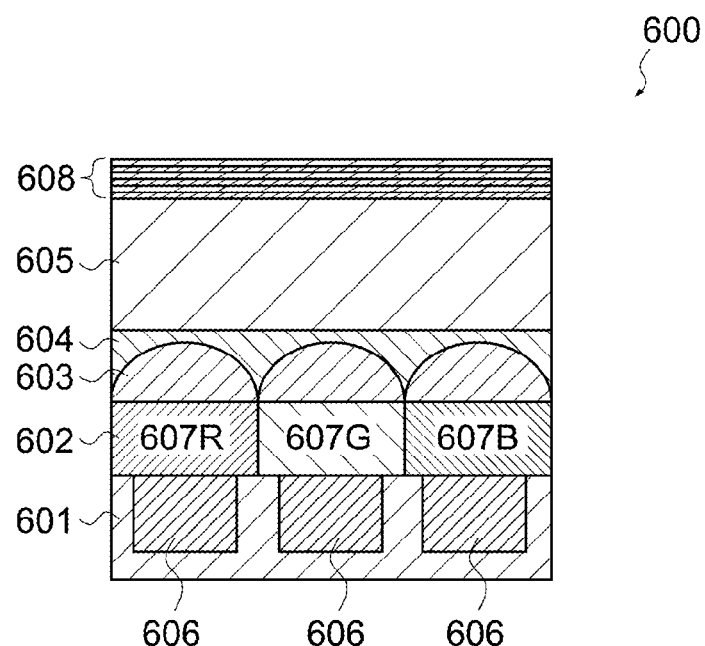
FIG. 14 A schematic diagram of an image capturing element according to a sixth embodiment of the present technology.

An image capturing element according to a sixth embodiment of the present technology will be described.
[Structure of Image Capturing Element]
FIG. 14 is a schematic diagram of an image capturing element 600 according to the embodiment. As shown in the same figure, the image capturing element 600 is configured of a photoelectric conversion layer 601, a color filter layer 602, on-chip lenses 603, a low refractive index layer 604, an infrared absorption layer 605 and a multilayer film infrared reflection layer 608 laminated.

The photoelectric conversion layer 601, the color filter layer 602, the on-chip lenses 603, the low refractive index layer 604 and the infrared absorption layer 605 can have the structures similar to those in the first embodiment. A plurality of photoelectric conversion elements 606 is formed in the color filter layer 601. The color filter layer 602 has a red color filter 607R, a green color filter 607G and a blue color filter 607B (hereinafter collectively referred to as color filters 607) corresponding to each photoelectric conversion element 606.

The multilayer film infrared reflection layer 608 has the structure similar to that of the third embodiment and is laminated on the infrared absorption layer 605. In the image capturing element 600 according to the embodiment, by both of the infrared absorption layer 605 and the multilayer film infrared reflection layer 608, the infrared components of the incident light can be removed.

Seventh Embodiment

Figure 15:
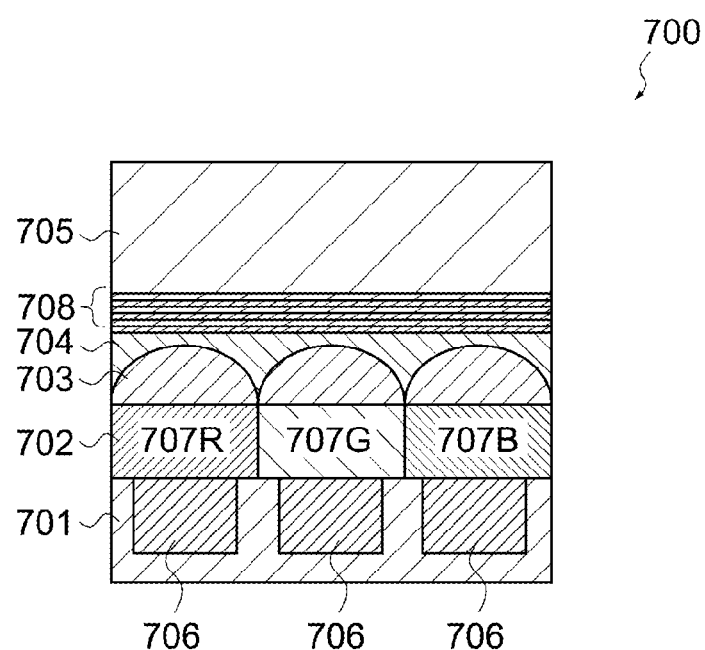
FIG. 15 A schematic diagram of an image capturing element according to a seventh embodiment of the present technology.

An image capturing element according to a seventh embodiment of the present technology will be described.
[Structure of Image Capturing Element]
FIG. 15 is a schematic diagram of an image capturing element 700 according to the embodiment. As shown in the same figure, the image capturing element 700 is configured of a photoelectric conversion layer 701, a color filter layer 702, on-chip lenses 703, a low refractive index layer 704, a multilayer film infrared reflection layer 708 and an infrared absorption layer 705 laminated.

The photoelectric conversion layer 701, the color filter layer 702, the on-chip lenses 703, the low refractive index layer 704 and the infrared absorption layer 705 can have the structures similar to those in the first embodiment. A plurality of photoelectric conversion elements 706 is formed in the color filter layer 701. The color filter layer 702 has a red color filter 707R, a green color filter 707G and a blue color filter 707B (hereinafter collectively referred to as color filters 707) corresponding to each photoelectric conversion element 706.

The multilayer film infrared reflection layer 708 has the structure similar to that of the third embodiment and is laminated on the low refractive index layer 704. Also, with such a structure, by the infrared absorption layer 705 and the multilayer film infrared reflection layer 708, the infrared components of the incident light can be removed.

Eighth Embodiment

Figure 16:
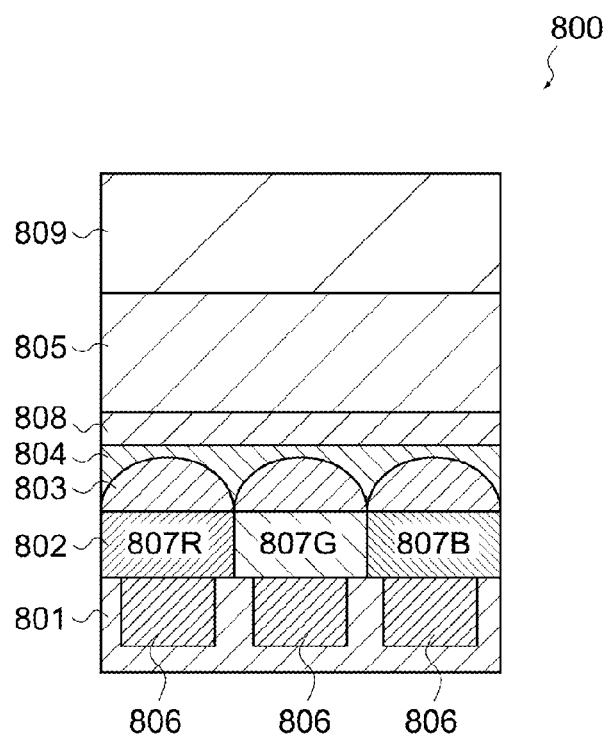
FIG. 16 A schematic diagram of an image capturing element according to an eighth embodiment of the present technology.

An image capturing element according to an eighth embodiment of the present technology will be described.
[Structure of Image Capturing Element]
FIG. 16 is a schematic diagram of an image capturing element 800 according to the embodiment. As shown in the same figure, the image capturing element 800 is configured of a photoelectric conversion layer 801, a color filter layer 802, on-chip lenses 803, a low refractive index layer 804, an adhesion layer 808, an infrared absorption layer 805 and a support substrate 809 laminated.

The photoelectric conversion layer 801, the color filter layer 802, the on-chip lenses 803 and the low refractive index layer 804 can have the structures similar to those in the first embodiment. A plurality of photoelectric conversion elements 806 is formed in the color filter layer 801. The color filter layer 802 has a red color filter 807R, a green color filter 807G and a blue color filter 807B (hereinafter collectively referred to as color filters 807) corresponding to each photoelectric conversion element 806.

The adhesion layer 808 is laminated on the low refractive index layer 804 to adhere the infrared absorption layer 805 to the low refractive index layer 804. The adhesion layer 808 can be composed of any material having an adhesion property, for example, of a synthetic resin, desirably having a high light transmission property.

The infrared absorption layer 805 has the structure similar to that of the first embodiment. Here in this embodiment, the infrared absorption layer 805 is laminated on the support substrate 809 during a manufacturing process of the image capturing element 800, and may be adhered to the lower layer structure (from the photoelectric conversion layer 801 to the low refractive index layer 804) by the support substrate 809 with the adhesive layer 808. In this manner, in the image capturing element, the lower structures can be produced by a production process (production apparatus) separately from the infrared absorption layer 805.

Ninth Embodiment

An image capturing element according to a ninth embodiment of the present technology will be described.
[Structure of Image Capturing Element]

Figure 17:
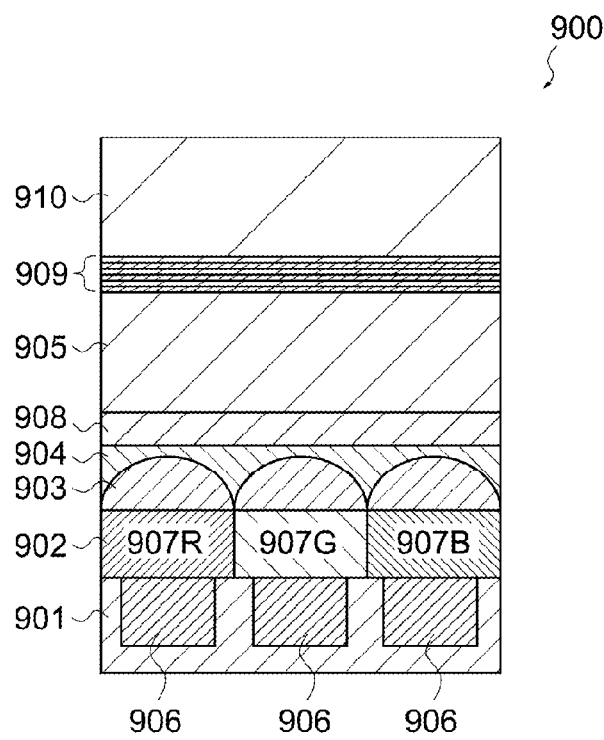
FIG. 17 A schematic diagram of an image capturing element according to a ninth embodiment of the present technology.

FIG. 17 is a schematic diagram of an image capturing element 900 according to the embodiment. As shown in the same figure, the image capturing element 900 is configured of a photoelectric conversion layer 901, a color filter layer 902, on-chip lenses 903, a low refractive index layer 904, a multilayer film infrared reflection layer 908, an infrared absorption layer 905, a multilayer film infrared reflection layer 909 and a support substrate 910 laminated.

The photoelectric conversion layer 901, the color filter layer 902, the on-chip lenses 903 and the low refractive index layer 904 can have the structures similar to those in the first embodiment. A plurality of photoelectric conversion elements 906 is formed in the color filter layer 901. The color filter layer 902 has a red color filter 907R, a green color filter 907G and a blue color filter 907B (hereinafter collectively referred to as color filters 907) corresponding to each photoelectric conversion element 906.

The adhesion layer 908 is laminated on the low refractive index layer 904 to adhere the infrared absorption layer 905 to the low refractive index layer 904. The adhesion layer 908 can be composed of any material having an adhesion property, for example, of a synthetic resin, desirably having a high light transmission property.

The support substrate 910 supports the multilayer film infrared reflection layer 909 and the infrared absorption layer 905. The support substrate 910 can be a plate-like member having a certain level of strength and can be composed of a material having a high light transmission property such as glass.

The multilayer film infrared reflection layer 909 and the infrared absorption layer 905 can be laminated on the support substrate 910 during a manufacturing process of the image capturing element 900. Specifically, the multilayer film infrared reflection layer 909 is firstly laminated on the support substrate 910 and then the infrared absorption layer 905 is laminated thereon.

In this embodiment, a laminate provided by laminating the multilayer film infrared reflection layer 909 and the infrared absorption layer 905 on the support substrate 910 is adhered to the lower layer structure (from the photoelectric conversion layer 901 to the low refractive index layer 904) with the adhesive layer 908. In this manner, in the image capturing element 900, the lower structures can be produced by a production process (production apparatus) separately from the multilayer film infrared reflection layer 909 and the infrared absorption layer 905.

Tenth Embodiment

An image capturing element according to a tenth embodiment of the present technology will be described.
[Structure of Image Capturing Element]

Figure 18:
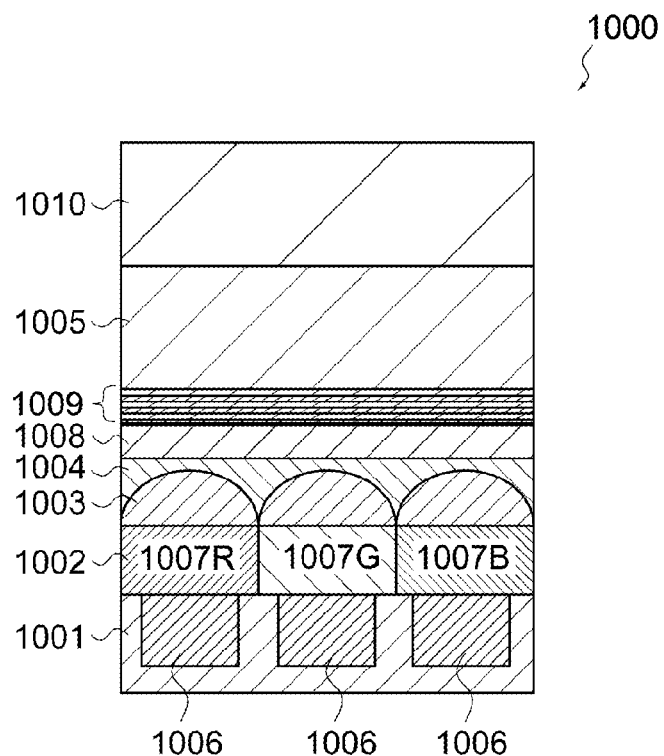
FIG. 18 A schematic diagram of an image capturing element according to a tenth embodiment of the present technology.

FIG. 18 is a schematic diagram of an image capturing element 1000 according to the embodiment. As shown in the same figure, the image capturing element 1000 is configured of a photoelectric conversion layer 1001, a color filter layer 1002, on-chip lenses 1003, a low refractive index layer 1004, an adhesion layer 1008, a multilayer film infrared reflection layer 1009, an infrared absorption layer 1005 and a support substrate 1010 laminated.

The photoelectric conversion layer 1001, the color filter layer 1002, the on-chip lenses 1003 and the low refractive index layer 1004 can have the structures similar to those in the first embodiment. A plurality of photoelectric conversion elements 1006 is formed in the color filter layer 1001. The color filter layer 1002 has a red color filter 1007R, a green color filter 1007G and a blue color filter 1007B (hereinafter collectively referred to as color filters 1007) corresponding to each photoelectric conversion element 1006.

The adhesion layer 1008 is laminated on the low refractive index layer 1004 to adhere the multilayer film infrared reflection layer 1009 to the low refractive index layer 1004. The adhesion layer 1008 can be composed of any material having an adhesion property, for example, of a synthetic resin, desirably having a high light transmission property.

The support substrate 1010 supports the infrared absorption layer 1005 and the multilayer film infrared reflection layer 1009. The support substrate 1010 can be a plate-like member having a certain level of strength and can be composed of a material having a high light transmission property such as glass.

The infrared absorption layer 1005 and the multilayer film infrared reflection layer 1009 can be laminated on the support substrate 1010 during a manufacturing process of the image capturing element 1000. Specifically, the infrared absorption layer 1005 is firstly laminated on the support substrate 1010 and then the multilayer film infrared reflection layer 1009 is laminated thereon.

In this embodiment, a laminate provided by laminating the infrared absorption layer 1005 and the multilayer film infrared reflection layer 1009 on the support substrate 1010 is adhered to the lower layer structure (from the photoelectric conversion layer 1001 to the low refractive index layer 1004) with the adhesive layer 1008. In this manner, in the image capturing element, the lower structures can be produced by a production process (production apparatus) separately from the infrared absorption layer 1005 and the multilayer film infrared reflection layer 1009.

Eleventh Embodiment

An image capturing element according to an eleventh embodiment of the present technology will be described.
[Structure of Image Capturing Element]

Figure 19:
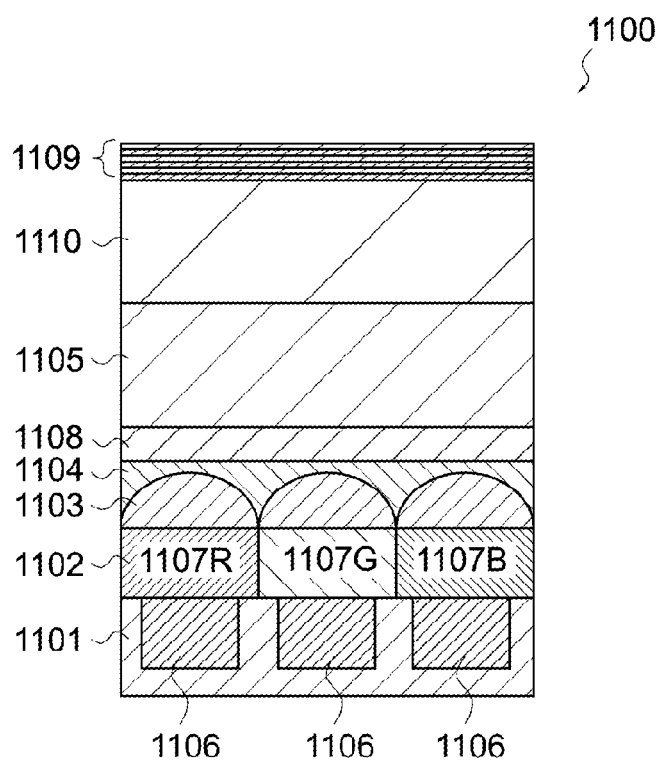
FIG. 19 A schematic diagram of an image capturing element according to an eleventh embodiment of the present technology.

FIG. 19 is a schematic diagram of an image capturing element 1100 according to the embodiment. As shown in the same figure, the image capturing element 1100 is configured of a photoelectric conversion layer 1101, a color filter layer 1102, on-chip lenses 1103, a low refractive index layer 1104, an adhesion layer 1108, an infrared absorption layer 1105, a support substrate 111 and a multilayer film infrared reflection layer 1009 laminated.

The photoelectric conversion layer 1101, the color filter layer 1102, the on-chip lenses 1103 and the low refractive index layer 1104 can have the structures similar to those in the first embodiment. A plurality of photoelectric conversion elements 1106 is formed in the color filter layer 1101. The color filter layer 1102 has a red color filter 1107R, a green color filter 1107G and a blue color filter 1107B (hereinafter collectively referred to as color filters 1107) corresponding to each photoelectric conversion element 1106.

The adhesion layer 1108 is laminated on the low refractive index layer 1104 to adhere the infrared absorption layer 1105 to the low refractive index layer 1104. The adhesion layer 1108 can be composed of any material having an adhesion property, for example, of a synthetic resin, desirably having a high light transmission property.

The support substrate 1110 supports the infrared absorption layer 1105 and the multilayer film infrared reflection layer 1109. The support substrate 1110 can be a plate-like member having a certain level of strength and can be composed of a material having a high light transmission property such as glass.

The infrared absorption layer 1105 and the multilayer film infrared reflection layer 1109 can be laminated on the support substrate 1110 during a manufacturing process of the image capturing element 1100. Specifically, the infrared absorption layer 1105 is firstly laminated on a one surface of the support substrate 1110 and then the multilayer film infrared reflection layer 1109 is laminated on the other surface of the support substrate 1110.

In this embodiment, a laminate provided by laminating the infrared absorption layer 1105 and the multilayer film infrared reflection layer 1109 on the support substrate 1110 is adhered to the lower layer structure (from the photoelectric conversion layer 1101 to the low refractive index layer 1104) with the adhesive layer 1108. In this manner, in the image capturing element 1100, the lower structures can be produced by a production process (production apparatus) separately from the infrared absorption layer 1105 and the multilayer film infrared reflection layer 1109.

Twelfth Embodiment

An image capturing element according to a twelfth embodiment of the present technology will be described.
[Structure of Image Capturing Element]

Figure 20:
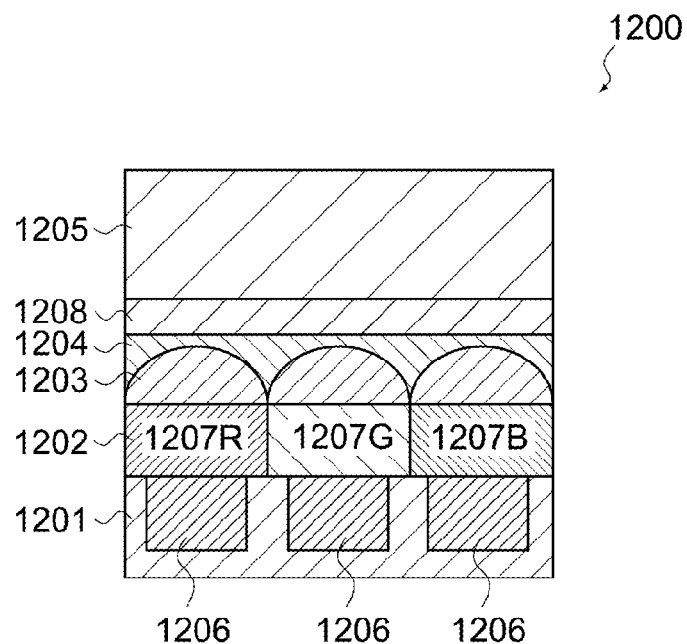
FIG. 20 A schematic diagram of an image capturing element according to a twelfth embodiment of the present technology.

FIG. 20 is a schematic diagram of an image capturing element 1200 according to the embodiment. As shown in the same figure, the image capturing element 1200 is configured of a photoelectric conversion layer 1201, a color filter layer 1202, on-chip lenses 1203, a low refractive index layer 1204, an adhesion layer 1208 and an infrared absorption layer 1205 laminated.

The photoelectric conversion layer 1201, the color filter layer 1202, the on-chip lenses 1203 and the low refractive index layer 1204 can have the structures similar to those in the first embodiment. A plurality of photoelectric conversion elements 1206 is formed in the color filter layer 1201. The color filter layer 1202 has a red color filter 1207R, a green color filter 1207G and a blue color filter 1207B (hereinafter collectively referred to as color filters 1207) corresponding to each photoelectric conversion element 1206.

The adhesion layer 1208 is laminated on the low refractive index layer 1204 to adhere the infrared absorption layer 1205 to the low refractive index layer 1204. The adhesion layer 1208 can be composed of any material having an adhesion property, for example, of a synthetic resin, desirably having a high light transmission property.

The infrared absorption layer 1205 is laminated on a support substrate not shown in a production process of the image capturing element 1200. A laminate provided by laminating the infrared absorption layer 1205 on the support substrate is adhered to the lower layer structure (from photoelectric conversion layer 1201 to the low refractive index layer 1204) with the adhesive layer 1208. After the adhesion, the support substrate is removed, thereby producing the image capturing element 1200.

In this embodiment, by removing the support substrate supporting the infrared absorption layer 1205, in the image capturing element 1200, the lower structures can be produced by a production process (production apparatus) separately from the infrared absorption layer 1205 even though no support substrate is included.

Thirteenth Embodiment

An image capturing element according to a thirteenth embodiment of the present technology will be described.
[Structure of Image Capturing Element]

Figure 21:
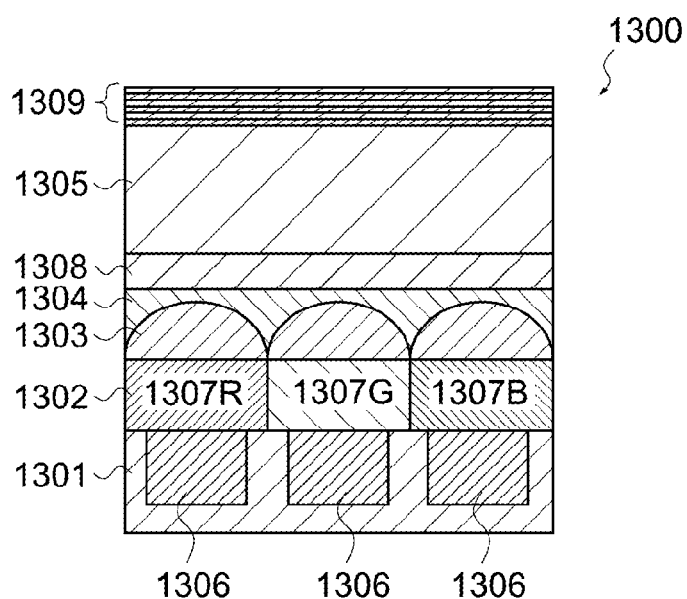
FIG. 21 A schematic diagram of an image capturing element according to a thirteenth embodiment of the present technology.

FIG. 21 is a schematic diagram of an image capturing element 1300 according to the embodiment. As shown in the same figure, the image capturing element 1300 is configured of a photoelectric conversion layer 1301, a color filter layer 1302, on-chip lenses 1303, a low refractive index layer 1304, an adhesion layer 1308, an infrared absorption layer 1305 and the multilayer film infrared reflection layer 1309 laminated.

The photoelectric conversion layer 1301, the color filter layer 1302, the on-chip lenses 1303 and the low refractive index layer 1304 can have the structures similar to those in the first embodiment. A plurality of photoelectric conversion elements 1306 is formed in the color filter layer 1301. The color filter layer 1302 has a red color filter 1307R, a green color filter 1307G and a blue color filter 1307B (hereinafter collectively referred to as color filters 1307) corresponding to each photoelectric conversion element 1306.

The adhesion layer 1308 is laminated on the low refractive index layer 1304 to adhere the infrared absorption layer 1305 to the low refractive index layer 1304. The adhesion layer 1308 can be composed of any material having an adhesion property, for example, of a synthetic resin, desirably having a high light transmission property.

The infrared absorption layer 1305 and the multilayer film infrared reflection layer 1309 are laminated on a support substrate not shown in a production process of the image capturing element 1300. Specifically, the multilayer film infrared reflection layer 1309 is laminated on the substrate and the infrared absorption layer 1305 is laminated thereon.

A laminate provided by laminating the multilayer film infrared reflection layer 1309 and the infrared absorption layer 1305 on the support substrate is adhered to the lower layer structure (from the photoelectric conversion layer 1301 to the low refractive index layer 1304) with the adhesive layer 1308. After the adhesion, the support substrate is removed, thereby producing the image capturing element 1300.

In this embodiment, by removing the support substrate supporting the multilayer film infrared reflection layer 1309 and the infrared absorption layer 1305, in the image capturing element 1300, the lower structures can be produced by a production process (production apparatus) separately from the multilayer film infrared reflection layer 1309 and the infrared absorption layer 1305 even though no support substrate is included.

Fourteenth Embodiment

An image capturing element according to a fourteenth embodiment of the present technology will be described.
[Structure of Image Capturing Element]

Figure 22:
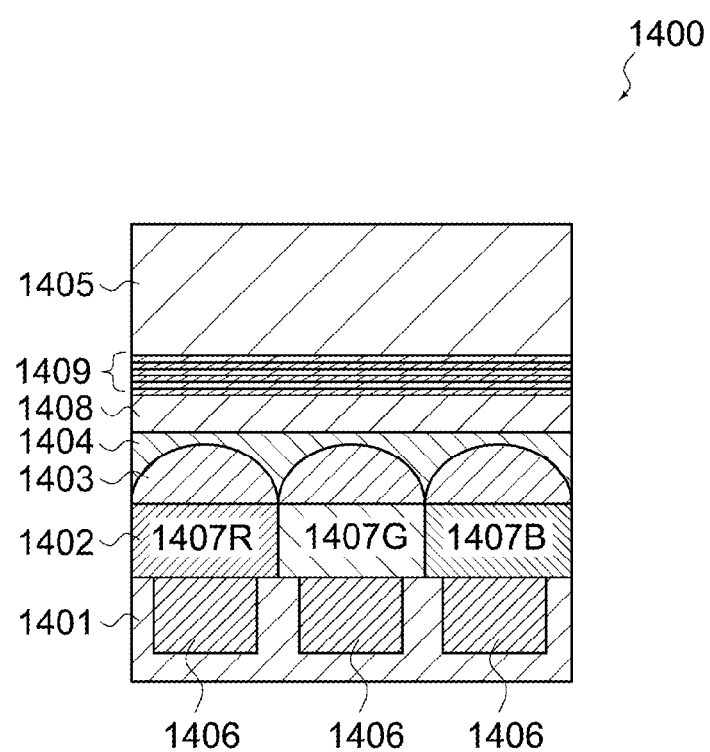
FIG. 22 A schematic diagram of an image capturing element according to a fourteenth embodiment of the present technology.

FIG. 22 is a schematic diagram of an image capturing element 1400 according to the embodiment. As shown in the same figure, the image capturing element 1400 is configured of a photoelectric conversion layer 1401, a color filter layer 1402, on-chip lenses 1403, a low refractive index layer 1404, an adhesion layer 1408, the multilayer film infrared reflection layer 1409 and an infrared absorption layer 1405 and laminated.

The photoelectric conversion layer 1401, the color filter layer 1402, the on-chip lenses 1403 and the low refractive index layer 1404 can have the structures similar to those in the first embodiment. A plurality of photoelectric conversion elements 1406 is formed in the color filter layer 1401. The color filter layer 1402 has a red color filter 1407R, a green color filter 1407G and a blue color filter 1407B (hereinafter collectively referred to as color filters 1407) corresponding to each photoelectric conversion element 1406.

The adhesion layer 1408 is laminated on the low refractive index layer 1404 to adhere the multilayer film infrared reflection layer 1409 to the low refractive index layer 1404. The adhesion layer 1408 can be composed of any material having an adhesion property, for example, of a synthetic resin, desirably having a high light transmission property.

The multilayer film infrared reflection layer 1409 and the infrared absorption layer 1405 are laminated on a support substrate not shown in a production process of the image capturing element 1400. Specifically, the infrared absorption layer 1405 is laminated on the substrate and multilayer film infrared reflection layer 1409 is laminated thereon.

A laminate provided by laminating the infrared absorption layer 1405 and the multilayer film infrared reflection layer 1409 on the support substrate is adhered to the lower layer structure (from the photoelectric conversion layer 1401 to the low refractive index layer 1404) with the adhesive layer 1408. After the adhesion, the support substrate is removed, thereby producing the image capturing element 1400.

In this embodiment, by removing the support substrate supporting the infrared absorption layer 1405 and the multilayer film infrared reflection layer 1409, in the image capturing element 1400, the lower structures can be produced by a production process (production apparatus) separately from the infrared absorption layer 1405 and the multilayer film infrared reflection layer 1409 and even though no support substrate is included.

The present technology is not limited to the above-described embodiments, and variations and modifications may be made without departing from the scope of the present technology.

For example, in the image capturing device according to each of the above-described embodiments, the reflection equipped layer described in the second embodiment may be laminated as an uppermost layer. In addition, when the multilayer infrared reflection layer is laminated on the infrared absorption layer, the protective layer described in the third embodiment may be disposed between the infrared absorption layer and the multilayer infrared reflection layer. Furthermore, as described in the first embodiment, the color filter layer is not necessarily disposed in the image capturing element in each embodiment.

The present disclosure may have the following configurations.

(1) An image capturing element, including:
an on-chip lens composed of a high refractive index material;
a low refractive index layer composed of a low refractive index material formed flatly on the on-chip lens; and
an infrared absorption layer composed of an infrared absorption material laminated above the low refractive index layer.

(2) The image capturing element according to (1) above, in which
the infrared absorption material includes an infrared absorption pigment.

(3) The image capturing element according to (1) or (2) above, in which
the infrared absorption material includes at least one of a binder resin and an additive.

(4) The image capturing element according to any one of (1) to (3) above, in which
the infrared absorption material has a heating yellowing temperature of 180° C. or more.

(5) The image capturing element according to (1) to (4) above, in which
the infrared absorption pigment has a maximum absorption wavelength of 600 nm to 1200 nm and has a molar absorbance coefficient of 1000 L/mol·cm or more.

(6) The image capturing element according to (1) to (5) above, in which
the infrared absorption layer has a thickness of 1 μm to 200 μm.

(7) The image capturing element according to (1) to (6) above, further including:
a multilayer infrared reflection layer composed of a multilayer film of a high refractive index material and a low refractive index material and laminated above the low refractive index layer.

(8) The image capturing element according to (1) to (7) above, further including:
a reflection prevention layer laminated as an uppermost layer for preventing reflection of light incident from an upper layer side or a lower layer side.

(9) The image capturing element according to (1) to (8) above, further including:
a color filter layer laminated below the on-chip lens.

(10) The image capturing element according to (1) to (9) above, in which
the color filter layer has an infrared absorption ability.

(11) The image capturing element according to (1) to (10) above, further including:
a support substrate for supporting the infrared absorption layer.

(12) The image capturing element according to (1) to (11) above, further including:
a support substrate for supporting the multilayer infrared reflection layer.

(13) The image capturing element according to (1) to (12) above, in which
the support substrate further supports the infrared absorption layer.

(14) The image capturing element according to (1) to (11) above, further including:
an adhesion layer composed of an adhesive material laminated on the low refractive index layer.

(15) An image capturing apparatus, including:
an image capturing element, including:
an on-chip lens composed of a high refractive index material;
a low refractive index layer composed of a low refractive index material formed flatly on the on-chip lens; and
an infrared absorption layer composed of an infrared absorption material laminated above the low refractive index layer; and
an image capturing optical system for capturing an image of an object on the image capturing element.

(16) The image capturing apparatus according to (15) above, further including:
an infrared cut filter disposed within the image capturing optical system or between the image capturing element and the image capturing optical system for decreasing an infrared component.

DESCRIPTION OF REFERENCE NUMERALS 100, 200, 300, 400, 500, 600, 700, 800, 900, 1000, 1100, 1200, 1300, 1400 image capturing element
101, 201, 301, 401, 501, 601, 701, 801, 901, 1001, 1101, 1201, 1301, 1401 photoelectric conversion layer
102, 202, 302, 402, 502, 602, 702, 802, 902, 1002, 1102, 1202, 1302, 1402 color filter layer
103, 203, 303, 403, 503, 603, 703, 803, 903, 1003, 1103, 1203, 1303, 1403 on-chip lens
104, 204, 304, 404, 504, 604, 704, 804, 904, 1004, 1104, 1204, 1304, 1404 low refractive index layer
105, 205, 305, 405, 505, 605, 705, 805, 905, 1005, 1105, 1205, 1305, 1405 infrared absorption layer
106, 206, 306, 406, 506, 606, 706, 806, 906, 1006, 1106, 1206, 1306, 1406 photoelectric conversion element
107, 207, 307, 407, 507, 607, 707, 807, 907, 1007, 1107, 1207, 1307, 1407 color filter

The invention claimed is:

1. An image capturing element, comprising:
   an on-chip lens composed of a high refractive index material;
   a low refractive index layer composed of a low refractive index material formed flatly on the on-chip lens;
   an infrared absorption layer composed of an infrared absorption material laminated above the low refractive index layer; and
   a multilayer infrared reflection layer composed of a multilayer film of a high refractive index material and a low refractive index material and laminated above the low refractive index layer.

2. The image capturing element according to claim 1, wherein the infrared absorption material includes an infrared absorption pigment.

3. The image capturing element according to claim 1, wherein the infrared absorption material includes at least one of a binder resin and an additive.

4. The image capturing element according to claim 1, wherein the infrared absorption material has a heating yellowing temperature of 180° C. or more.

5. The image capturing element according to claim 2, wherein the infrared absorption pigment has a maximum absorption wavelength of 600 nm to 1200 nm and has a molar absorbance coefficient of 1000 L/mol cm or more.

6. The image capturing element according to claim 1, wherein the infrared absorption layer has a thickness of 1 μm to 200 μm.

7. The image capturing element according to claim 1, further comprising:
   a reflection prevention layer laminated as an uppermost layer to prevent reflection of light incident from an upper layer side or a lower layer side.

8. The image capturing element according to claim 1, further comprising:
   a color filter layer laminated below the on-chip lens.

9. The image capturing element according to claim 8, wherein the color filter layer has an infrared absorption ability.

10. The image capturing element according to claim 1, further comprising:
    a support substrate that supports the infrared absorption layer.

11. The image capturing element according to claim 1, further comprising:
    a support substrate that supports the multilayer infrared reflection layer.

12. The image capturing element according to claim 11, wherein the support substrate further supports the infrared absorption layer.

13. The image capturing element according to claim 1, further comprising:
    an adhesion layer composed of an adhesive material laminated on the low refractive index layer.

14. An image capturing apparatus, comprising:
    an image capturing element, including:
      an on-chip lens composed of a high refractive index material;
      a low refractive index layer composed of a low refractive index material formed flatly on the on-chip lens;
      an infrared absorption layer composed of an infrared absorption material laminated above the low refractive index layer; and
      a multilayer infrared reflection layer composed of a multilayer film of a high refractive index material and a low refractive index material and laminated above the low refractive index layer; and
    an image capturing optical system configured to capture an image of an object on the image capturing element.

15. The image capturing apparatus according to claim 14, further comprising:
    an infrared cut filter disposed within the image capturing optical system or between the image capturing element and the image capturing optical system to decrease an infrared component.

16. The image capturing element according to claim 1, wherein the low refractive index layer lies between the on-chip lens and the infrared absorption layer.

17. An image capturing element, comprising:
    an on-chip lens composed of a high refractive index material;
    a low refractive index layer composed of a low refractive index material formed flatly on the on-chip lens; and
    an infrared absorption layer composed of an infrared absorption material laminated above the low refractive index layer, wherein the infrared absorption material includes an infrared absorption pigment, wherein the infrared absorption material includes at least one of a binder resin and an additive, and wherein the infrared absorption material has a heating yellowing temperature of 180° C. or more.

* * * * *